(12) United States Patent
Soutome et al.

(10) Patent No.: US 8,742,759 B2
(45) Date of Patent: Jun. 3, 2014

(54) HIGH-FREQUENCY COIL AND MAGNETIC RESONANCE IMAGING DEVICE

(75) Inventors: Yoshihisa Soutome, Tokyo (JP); Hideta Habara, Musashino (JP); Yoshitaka Bito, Kokubunji (JP)

(73) Assignee: Hitachi Medical Corporation, Tokyo (JP)

( * ) Notice: Subject to any disclaimer, the term of this patent is extended or adjusted under 35 U.S.C. 154(b) by 401 days.

(21) Appl. No.: 13/054,474

(22) PCT Filed: Jul. 22, 2009

(86) PCT No.: PCT/JP2009/063107
§ 371 (c)(1),
(2), (4) Date: Jan. 14, 2011

(87) PCT Pub. No.: WO2010/021222
PCT Pub. Date: Feb. 25, 2010

(65) Prior Publication Data
US 2011/0121834 A1    May 26, 2011

(30) Foreign Application Priority Data

Aug. 18, 2008 (JP) .................................. 2008-209485

(51) Int. Cl.
*G01V 3/00* (2006.01)
(52) U.S. Cl.
USPC .......................................... 324/318; 324/322
(58) Field of Classification Search
USPC .................................. 324/318, 319, 321, 322
See application file for complete search history.

(56) References Cited

U.S. PATENT DOCUMENTS

| | | | |
|---|---|---|---|
| 4,825,162 A | 4/1989 | Roemer et al. | |
| 5,280,246 A | 1/1994 | Takahashi et al. | |
| 5,327,898 A | 7/1994 | Yoshino et al. | |
| 5,489,847 A | 2/1996 | Nabeshima et al. | |
| 5,804,969 A * | 9/1998 | Lian et al. | 324/318 |
| 7,932,721 B2 * | 4/2011 | Nascimento et al. | 324/318 |
| 8,035,382 B2 * | 10/2011 | DeVries et al. | 324/318 |
| 2002/0089329 A1 | 7/2002 | Harvey et al. | |
| 2004/0124840 A1 | 7/2004 | Reykowski | |

FOREIGN PATENT DOCUMENTS

| | | |
|---|---|---|
| JP | 2261428 | 10/1990 |
| JP | 3-216938 | 9/1991 |
| JP | 5269108 | 10/1993 |
| JP | 7079948 | 3/1995 |
| JP | 2001-128956 | 5/2001 |
| JP | 2002-169374 | 6/2002 |

OTHER PUBLICATIONS

"A novel decoupling technique for non-overlapped microstrip array coil at 7T MR imaging" by Xie, et al., p. 1068, Proc. Intl. Soc. Mag. Reson. Med. 16 (2008).

(Continued)

*Primary Examiner* — Louis Arana
(74) *Attorney, Agent, or Firm* — Brundidge & Stanger, P.C.

(57) ABSTRACT

There is provided a high-frequency coil of an MRI device, which can easily and highly reproducibly reduce electromagnetic coupling between adjacent surface coils among a plurality of surface coils disposed with intervals. An electromagnetic decoupling coil that can generate a magnetic flux for canceling a magnetic flux generated by one of the adjacent surface coils and interlinking with the other surface coil is disposed between the adjacent surface coils. The electromagnetic decoupling coil is provided with a capacitor, and is tuned by means of the capacitor so that the electromagnetic coupling should be minimized in such a range that the resonance frequency thereof should be lower than the resonance frequency of the surface coils.

17 Claims, 23 Drawing Sheets

(56) References Cited

OTHER PUBLICATIONS

"A shielding-based decoupling tecqnique for coil array design" by P. Qu, et al., Proc. Intl. Soc. Mag. Reson. Med. 11 (2004), p. 1605.

"SENSE: Sensitivity Encoding for Fast MRI", K. Pruessmann, et al., Magnetic Resonance in Medicine, vol. 42, pp. 952-962 (1999).

"The NMR Phased Array", Magnetic Resonance in Medicine, vol. 16, pp. 192-225 (1990).

"A novel method to reduce the signal coupling of surface coils for MRI" by J. Wang., p. 1434, vol. 3, (1996).

"Coupling and decoupling theory and its application to the MRI Phased Array", Magnetic Resonance in Medicine, vol. 48, pp. 203-213 (2002), Lee et al.

"Specific Coil Design for SENSE: A Six-Element Cardiac Array", Magnetic Resonance in Medicine, vol. 45, pp. 495-504 (2004).

* cited by examiner

HIGH-FREQUENCY COIL AND MAGNETIC RESONANCE IMAGING DEVICE

TECHNICAL FIELD

The present invention relates to a magnetic resonance imaging (MRI) device, in particular, a high-frequency coil for detecting magnetic resonance signals.

BACKGROUND ART

An MRI device is a medical diagnostic imaging apparatus, which induces magnetic resonance in nuclei in an arbitrary section of a test subject, and provides a tomogram for the section from generated magnetic resonance signals. When a high-frequency magnetic field is irradiated on a living body rested in a static magnetic field by a high-frequency coil (RF coil) with applying a gradient magnetic field, atomic nuclei in the living body, for example, hydrogen nuclei, are excited, and when the excited hydrogen nuclei return to the equilibrated state, circularly polarized magnetic fields are generated as magnetic resonance signals. These signals are detected with an RF coil and subjected to signal processing to visualize hydrogen nucleus distribution in the living body. In order to obtain an image of high precision and high resolution, improvements in receiving sensitivity, Signal-to-Noise (SN) ratio, etc. are desired for the RF coil for detecting magnetic resonance signals.

In recent years, a technique called parallel imaging is used, in which a plurality of coils showing different sensitivity profiles are used to execute an imaging sequence with reduced phase encoding steps, and aliasing artifacts of images are eliminated by an operation utilizing the sensitivity profiles of the RF coils (for example, refer to Non-patent document 1). According to the parallel imaging, imaging time is shortened to the extent that the phase encoding steps are reduced. Also for this parallel imaging, improvements in receiving sensitivity and SN ratio of the RF coil are desired.

Moreover, there are imaging techniques aiming at enlargement of detection range among those utilizing a plurality of RF coils. For example, there is a technique of using a plurality of surface coils to detect magnetic resonance signals from a test subject, and synthesizing the output signals of the surface coils to obtain an image with high SN ratio for a wide range (for example, refer to Patent document 1). In this technique, a plurality of surface coils are disposed near a region of the object of the imaging, and magnetic resonance signals from the test subject are detected by using a plurality of those surface coils. Magnetic resonance signals detected with each surface coil are subjected to a signal processing to generate image data for every surface coil. Then, pixel data corresponding to the same position in the generated images are multiplied with weighting coefficients obtained from the sensitivity profiles of the surface coils, and added.

When imaging is performed by using a plurality of surface coils, if electromagnetic coupling arises between a plurality of the surface coils to be used, high frequency signals generated in one surface coil are also induced in the other surface coil at a certain ratio. Noises are increased by the induced high frequency signals, and the SN ratio of output signals is reduced. Therefore, it is necessary to prevent electromagnetic coupling between surface coils.

As techniques for preventing electromagnetic coupling between coils, there are a method of disposing adjacent coils with partial overlap and controlling areas of the overlap of the loops (for example, refer to Non-patent document 2), a method of serially inserting inductors into a loop conducting wire of each coil at close positions to cancel the electromagnetic coupling (refer to, for example, Patent document 2), a method of inserting capacitors into loop conducting wires of adjacent coils so that a part of the capacitors is shared by the coils and tuning values of the capacitors to prevent the electromagnetic coupling (refer to, for example, Non-patent document 3), a method of connecting parts of adjacent coils with a neutralization circuit comprising capacitors (refer to, for example, Patent document 3), a method of disposing a figure-of-eight coil or a loop coil so as to overlap with two adjacent coils (refer to, for example, Patent document 4), a method of using a low input impedance of an preamplifier for amplifying magnetic resonance signals detected by coils (refer to, for example, Non-patent document 2), a method of connecting an impedance controlling circuit between a coil and a preamplifier (refer to, for example, Non-patent document 4), and so forth.

When loops of a plurality of RF coils used for the detection partially overlap with each other, the sensitivity profiles of the overlapping portions of the RF coils shows the same tendency, and difference of the sensitivity profiles of both RF coils becomes small. In the parallel imaging, if the difference of sensitivity profiles becomes small, the SN ratio is degraded in the operation for eliminating the aliasing artifacts of images. Therefore, it is known that, in the parallel imaging, disposition of a plurality of RF coils with intervals provides a higher SN ratio in an image to be obtained compared with disposition of them with partial overlap (refer to, for example, Non-patent document 5).

PRIOR ART REFERENCES

Patent Documents

Patent document 1: U.S. Pat. No. 4,825,162
Patent document 2: Japanese Patent No. 3216938
Patent document 3: U.S. Patent Published Application No. 2002/0169374
Patent document 4: Japanese Patent Unexamined Publication (KOKAI) No. 2001-128956

Non-Patent Documents

Non-patent document 1: K. P. Pruessmann et al., "SENSE: Sensitivity Encoding for Fast MRI", Magnetic Resonance in Medicine, Vol. 42, pp. 952-962 (1999)
Non-patent document 2: P. B. Roemer et al., "The NMR Phased Array", Magnetic Resonance in Medicine, Vol. 16, pp. 192-225 (1990)
Non-patent document 3: J. Wang, "A Novel Method to Reduce the Signal Coupling of Surface Coils for MRI", Proceedings of the 4th International Society of Magnetic Resonance in Medicine, Vol. 3, p. 1434 (1996)
Non-patent document 4: R. F. Lee et al., "Coupling and Decoupling Theory and Its Application to the MRI Phased Array", Magnetic Resonance in Medicine, Vol. 48, pp. 203-213 (2002)
Non-patent document 5: M. Weiger et al., "Specific Coil Design for SENSE: A Six-Element Cardiac Array", Magnetic Resonance in Medicine, Vol. 45, pp. 495-504 (2001)

SUMMARY OF THE INVENTION

Problem to be Solved by the Invention

In the parallel imaging, it is necessary to prevent electromagnetic coupling between a plurality of RF coils disposed with intervals. Therefore, the above-mentioned techniques described in Non-patent documents 2 and 3 cannot be used. Further, although the technique disclosed in Patent document 2 can be applied, it is necessary to manually perform fine tuning of the positions and shapes of inductors, thus the tuning takes time and effort, and the reproducibility is poor. The technique disclosed in Patent document 3 required tuning with changing a plurality of capacitor values, and thus the tuning is difficult. Similarly, in the technique disclosed in Patent document 4, degree of the electromagnetic coupling significantly changes depending on the shapes and arrangement of RF coils to be overlapped, therefore reproducibility is poor, and the tuning is also difficult. Furthermore, the technique disclosed in Non-patent document 2 requires to set an input impedance value as small as 1Ω or smaller for obtaining sufficient effect for preventing the electromagnetic coupling, but decreasing the input impedance value invites reduction of the amplification ratio in the preamplifier, and the SN ratio of images to be obtained is degraded as a result. In the technique disclosed in Non-patent document 4, since the impedance controlling circuit consists of a plurality of inductors and capacitors, it is necessary to tune values of a plurality of the inductors and capacitors with changing them, and thus the tuning is difficult. Furthermore, as the number of RF coils increases, tuning points for preventing the electromagnetic coupling increase, therefore the tuning takes time and effort, and the production cost of the RF coils rises as a result.

The present invention was accomplished in light of the above-mentioned circumstances, and an object of the present invention is to provide a technique for preventing electromagnetic coupling between adjacent RF coils in an MRI device provided with a plurality of RF coils disposed with intervals, with high reproducibility and easy tuning.

Means to Solve the Problem

According to the present invention, a means that can generate a magnetic flux canceling a magnetic flux generated by one RF coil among adjacent RF coils and interlinking with the other RF coil is disposed between the adjacent RF coils.

Specifically, the present invention provide a high-frequency coil for a magnetic resonance imaging device having a plurality of surface coils and a resonance frequency corresponding to a frequency of magnetic resonance signal of a predetermined nucleus comprising, an electromagnetic decoupling means for preventing electromagnetic coupling between adjacent surface coils among a plurality of the surface coils, wherein: a plurality of the surface coils are disposed with intervals along a first direction, the electromagnetic decoupling means has a loop conductor comprising a capacitor, the loop conductor is disposed at such a position that the loop conductor should be magnetically coupled with the two adjacent surface coils and generate a magnetic flux in a direction for canceling a magnetic flux generated by one of the two adjacent surface coils and interlinking with the other surface coil, and the loop conductor should not contact with both the surface coils, and inductance of the loop conductor and value of the capacitor are tuned so that sum of magnetic fluxes interlinking with the other surface coil should be minimized, and resonance frequency of the electromagnetic decoupling means should be smaller than resonance frequency of the high-frequency coil.

Effect of the Invention

According to the present invention, in an MRI device provided with a plurality of RF coils, electromagnetic coupling between adjacent RF coils disposed with an interval can be prevented by a technique showing high reproducibility and feasible with easy tuning operation.

MODES FOR CARRYING OUT THE INVENTION

First Embodiment

The first embodiment of the present invention will be explained below. Hereafter, in all the drawings for explaining embodiments of the present invention, those having the same function are indicated with the same symbols, and repetition of explanation thereof is omitted.

Figure 1A:
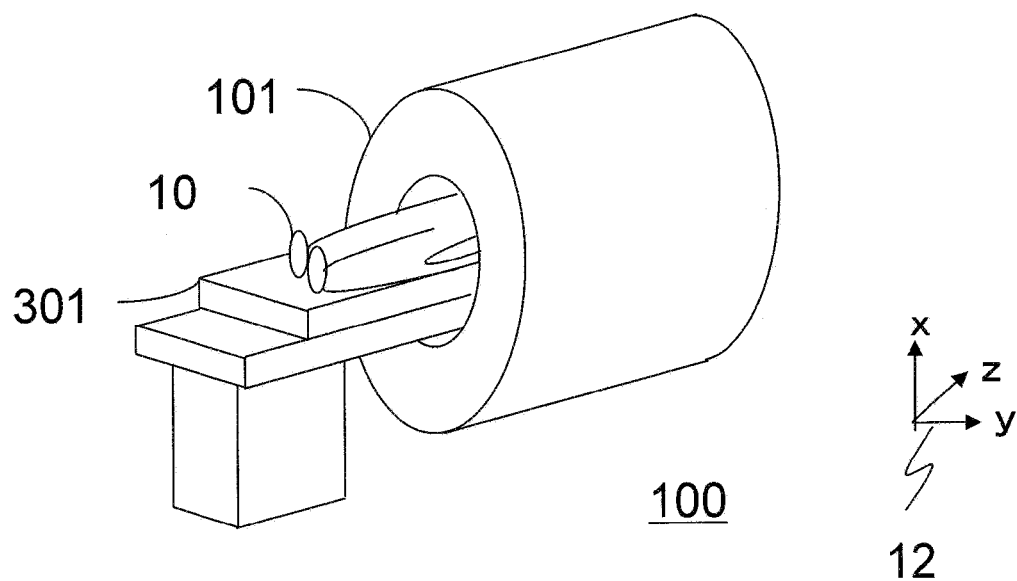
FIG. 1A shows external views of MRI device of a horizontal magnetic field type according to the first embodiment.
Figure 1B:
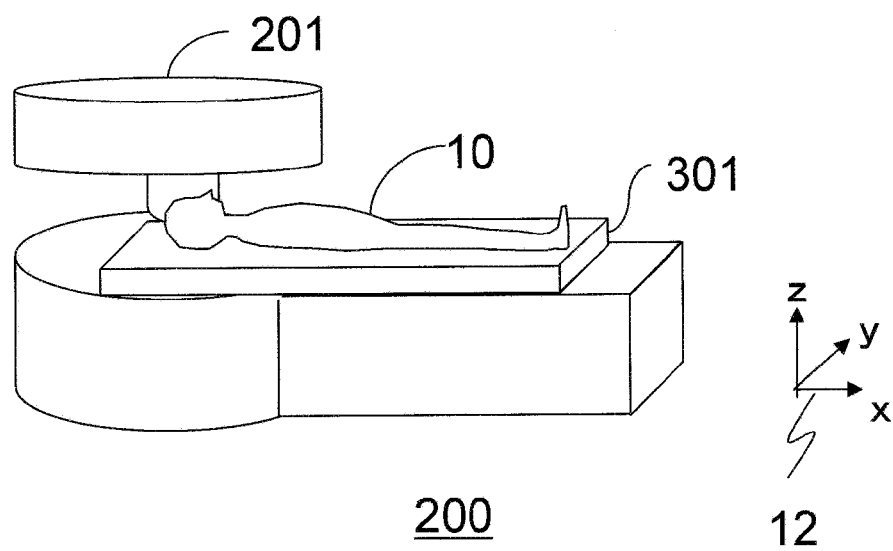
FIG. 1B shows external views of MRI device of a vertical magnetic field type according to the first embodiment.

First, the total configuration of an MRI device according to this embodiment will be explained. FIG. 1A and FIG. 1B show external views of MRI devices according to this embodiment, and in the drawings, the direction of the z-axis of the coordinate system 12 is the direction of static magnetic field. FIG. 1A shows an MRI device 100 provided with a horizontal magnetic field type magnet 101, in which a test subject 10 is inserted into a space for imaging in a bore of the magnet 101 in a state of being laid down on a patient table 301 and subjected to imaging. FIG. 1B shows an MRI device 200 provided with vertical magnetic field type magnets 201, in which a test subject 10 is inserted into a space for imaging between a pair of the up and down magnets 201 in a state of being laid down on a patient table 301 and subjected to imaging. In this embodiment, the MRI device may be either one of the horizontal magnetic field type or one of the vertical magnetic field type. Hereafter, explanations are made with reference to an MRI device of the horizontal magnetic field type as an example.

Figure 2:
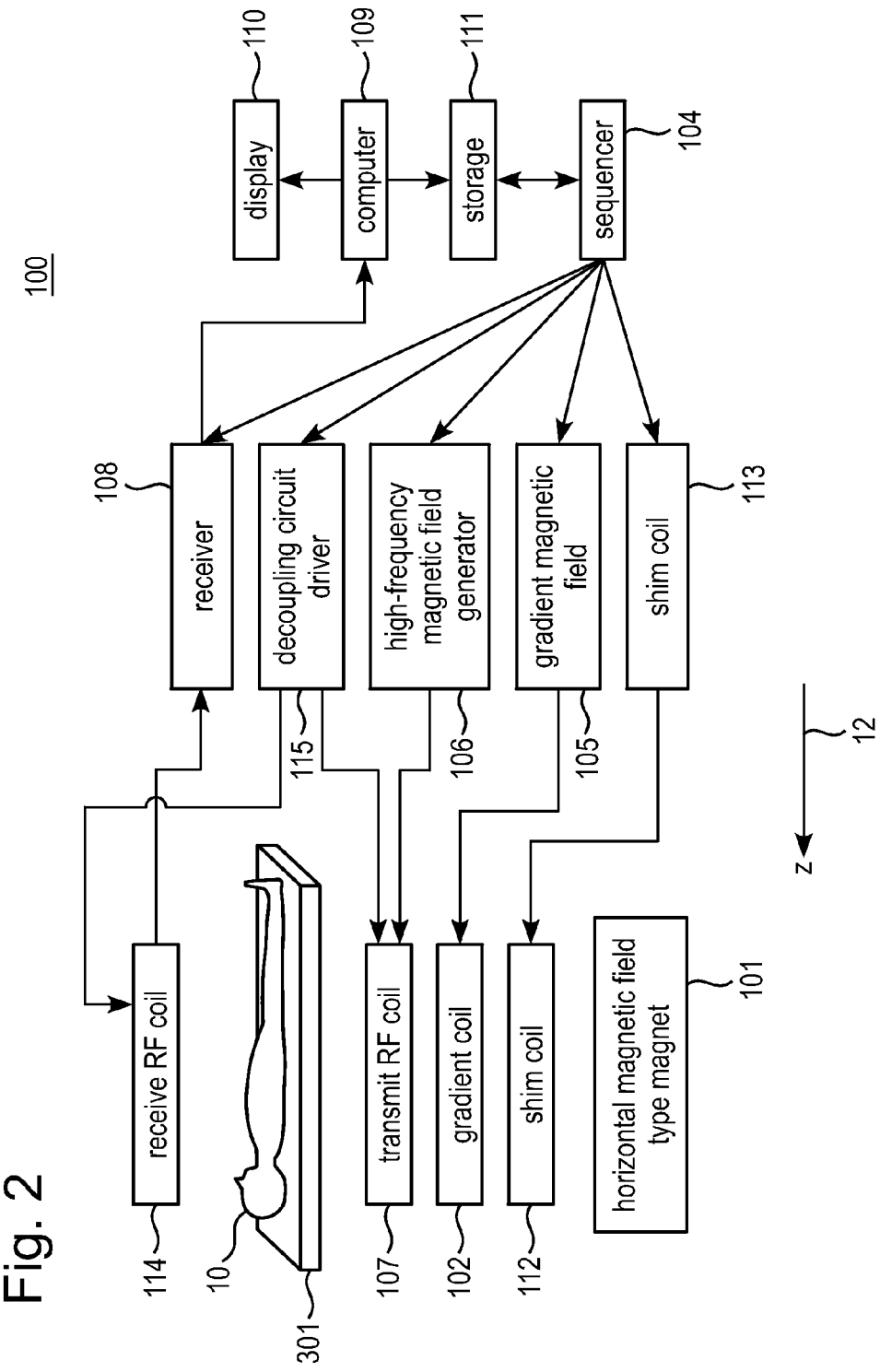
FIG. 2 is a block diagram showing a schematic configuration of an MRI device according to the first embodiment.

FIG. 2 is a block diagram showing a schematic configuration of the MRI device 100. The same elements as those shown in FIG. 1A and FIG. 1B are shown with the same symbols. The MRI device 100 according to this embodiment is provided with the horizontal magnetic field type magnet 101, a gradient coil 102, a shim coil 112 for controlling uniformity of static magnetic field, a sequencer 104, a transmit RF coil 107 which generates a high-frequency magnetic field, and a receive RF coil 114 which receives magnetic resonance signals generated from a test subject 10. The gradient coil 102 and the shim coil 112 are connected to a power supply for gradient magnetic field 105 and a power supply for shim coil 113, respectively. The transmit RE coil 107 is connected to a high-frequency magnetic field generator 106, and the receive RF coil 114 is connected to a receiver 108 provided with a detection circuit and an A/D converter. When there are used a plurality of the receive RF coils 114, the receiver 108 is connected to each receive RF coil 114.

The sequencer 104 sends commands to the power supply for gradient magnetic field 105, the power supply for shim coil 113, and the high-frequency magnetic field generator 106 to make them generate a gradient magnetic field and a high-frequency magnetic field, respectively. The high-frequency magnetic field is applied to the test subject 10 via the transmit RF coil 107. Magnetic resonance signals generated from the test subject 10 upon applying the high-frequency magnetic field are detected by the receive RF coil 114.

The transmit RF coil 107 and the receive RF coil 114 are each provided with a decoupling circuit, which is connected to a decoupling circuit driver 115. The sequencer 104 sends commands to the decoupling circuit driver 115 to make it transmit a decoupling signal which controls activation and inactivation of the transmit RF coil 107 and the receive RF coil 114. When a high-frequency magnetic field is applied to the test subject 10 via the transmit RF coil 107, the decoupling circuit driver 115 transmits a decoupling signal to the receive RF coil 114 according to the command sent from the sequencer 104. In response to that, the receive RF coil 114 is inactivated by the decoupling circuit, and thus electromagnetic coupling with the transmit RF coil 107 is prevented. When the receive RF coil 114 receives magnetic resonance signals generated by the test subject 10, the decoupling circuit driver 115 transmits a decoupling signal to the transmit RF coil 107 according to the command transmitted from the sequencer 104. In response to that, the transmit RF coil 107 is inactivated by the decoupling circuit, and thus electromagnetic coupling with the receive RF coil 114 is prevented.

The magnetic resonance signals detected by the receive RF coil 114 are amplified by a preamplifier, and detected by the receiver 108. A frequency of the magnetic resonance signals used as a basis of detection in the receiver 108 (henceforth referred to as magnetic resonance frequency) is set by the sequencer 104. The detected signals are sent to a computer 109 via the A/D converter, and signal processing such as image reconstruction is performed in the computer. The results of the processing are displayed on a display 110. The detected signals and measurement conditions are saved in a storage 111 as required. The sequencer 104 controls those components so that they should operate at timings and intensities programmed beforehand.

The MRI device 100 of this embodiment is provided with an RF coil unit having two surface coils disposed with an interval and a means for preventing electromagnetic coupling of the two surface coils as the receive RF coil 114. Hereafter, the details of this RF coil unit are explained.

Figure 3A:
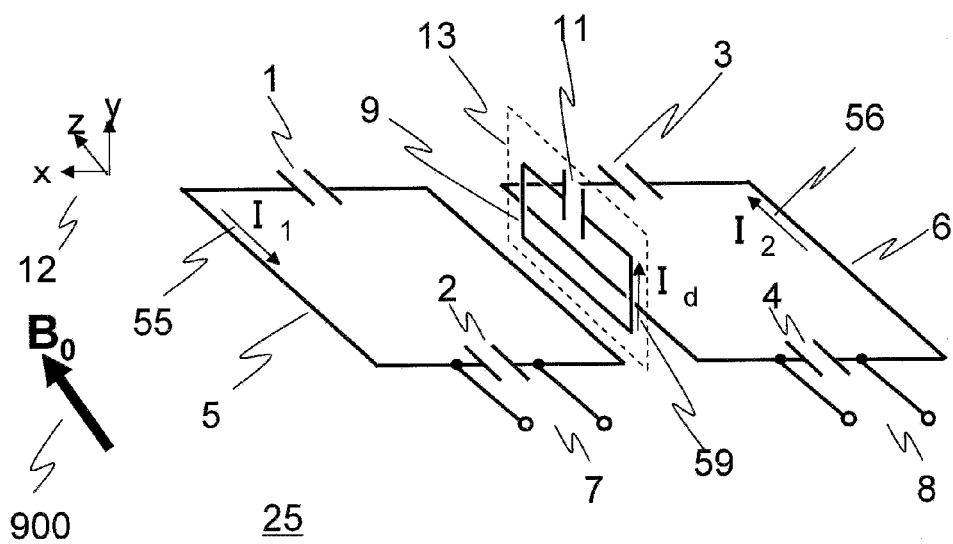
FIG. 3A shows a configuration diagram (a perspective view) of an RF coil unit according to the first embodiment.
Figure 3B:
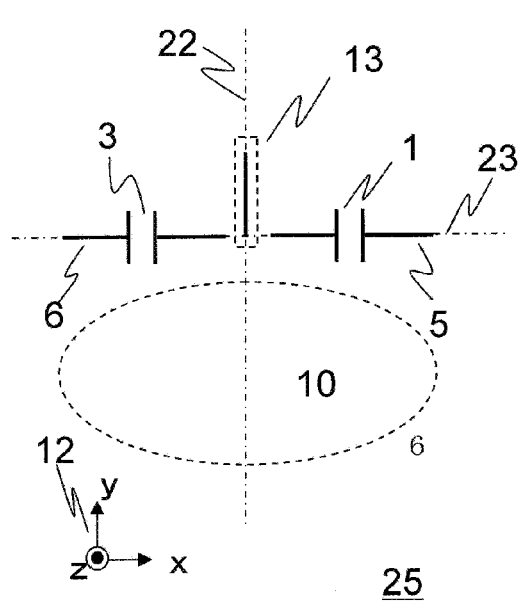
FIG. 3B shows a configuration diagram (a plane view seen in the direction opposing to the z-axis) of an RF coil unit according to the first embodiment.
Figure 3C:
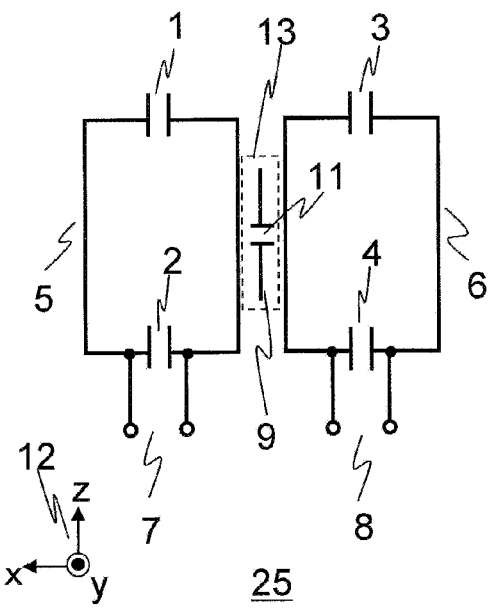
FIG. 3C shows a configuration diagram (a plane view seen in the direction opposing to the y-axis) of an RF coil unit according to the first embodiment.

FIG. 3A, FIG. 3B and FIG. 3C include drawings for explaining the configuration of an RF coil unit 25 according to this embodiment. In the drawings, the direction of the static magnetic field 900 generated by the horizontal magnetic field type magnet 101 is the z-axis direction of the coordinate system 12. FIG. 3A is a view of the RF coil unit 25 seen from obliquely above, and FIG. 3B is a plane view of the RF coil unit 25 seen in the direction opposing to the z-axis. Further, FIG. 3C is a plane view of the RF coil unit 25 seen in the direction opposing to the y-axis.

As shown in FIG. 3A, the RF coil unit 25 of this embodiment is provided with a first surface coil 5 having a rectangular loop conductor inserted with a first capacitor 1 and a second capacitor 2, a second surface coil 6 having a rectangular loop conductor inserted with a third capacitor 3 and a fourth capacitor 4, an electromagnetic decoupling coil 13 having a rectangular loop conductor 9 inserted with a capacitor 11, first signal lines 7, and second signal lines 8. The first surface coil 5 and the second surface coil 6 are each provided with a decoupling circuit for preventing electromagnetic coupling with the transmit RF coil 107. However, in FIG. 3A, FIG. 3B and FIG. 3C, such decoupling circuits are not shown to make the drawings easy to see. Further, inductance and resistance of the electromagnetic decoupling coil 13 itself for the first surface coil 5 and the second surface coil 6 are not also shown.

The first signal lines 7 and the second signal lines 8 are connected to both ends of the second capacitor 2 and the fourth capacitor 4, respectively. In addition, the first signal lines 7 and the second signal lines 8 are each connected to a balun (balanced-to-unbalanced transformer, not shown) for eliminating common node noise, and the balun is connected to a preamplifier (not shown). Furthermore, output terminal of the preamplifier is connected to the receiver 108 via a coaxial cable.

As shown in FIG. 3B and FIG. 3C, the first surface coil 5 and the second surface coil 6 are disposed near the test subject 10 with an interval in a direction perpendicular to the direction of the static magnetic field 900 (in the drawings, the x-axis direction of the coordinate system 12). The electromagnetic decoupling coil 13 is disposed between the first surface coil 5 and the second surface coil 6. In this case, as shown in FIG. 3B, they are disposed so that an angle formed by a first plane 22 in which the electromagnetic decoupling coil 13 substantially locates and a second plane 23 in which the first surface coil 5 and the second surface coil 6 substantially locate should become about 90 degrees. The term "about" used here means that difference of the angle caused by manufacturing error of the coil may be allowable. Further, the electromagnetic decoupling coil 13 is disposed so that a part of the loop conductor 9 of the electromagnetic decoupling coil 13 should locate in the second plane 23.

In the RF coil unit 25 of this embodiment having the aforementioned configuration, inductance $L_1$ of the loop conductor, value $C_1$ of the first capacitor 1, and value $C_2$ of the second capacitor 2 in the first surface coil 5, inductance $L_2$ of the loop conductor, value $C_3$ of the third capacitor 3, and value $C_4$ of the fourth capacitor 4 in the second surface coil 6, inductances $L_d$ of the loop conductor 9 and value $C_d$ of the capacitor 11 in the electromagnetic decoupling coil 13 are each tuned so that the electromagnetic coupling between the first surface coil 5 and the second surface coil 6 should be prevented, the first surface coil 5 and the second surface coil 6 should resonate at a magnetic resonance frequency of a predetermined element, and impedance values of both the surface coils should be the same predetermined value at the magnetic resonance frequency of the predetermined element.

First, each of the values $C_1$, $C_2$, $C_3$ and $C_4$ of the first capacitor 1, the second capacitor 2, the third capacitor 3, and the fourth capacitor 4 respectively are tuned so that the first surface coil 5 and the second surface coil 6 independently resonate at the magnetic resonance frequency ($f_H$ (MHz)) of the element to be detected (for example, proton), and the impedances should be a predetermined value ($K(\Omega)$). Then, the inductance $L_d$ of the loop conductor 9 and the value $C_d$ of the capacitor 11 in the electromagnetic decoupling coil 13 are determined so that the electromagnetic coupling between the first surface coil 5 and the second surface coil 6 should be minimized under the conditions that the resonance frequency ($f_d$) of the electromagnetic decoupling coil 13 becomes smaller than $f_H$, and the following equation (1) is satisfied.

$$\frac{\omega_H^2 L_d C_d}{Q_H(\omega_H^2 L_d C_d - 1)} < \frac{1}{20} \quad (1)$$

In the equation, $Q_H$ represents the Q factor at the time of resonating the loop conductor 9 of the electromagnetic decoupling coil 13 at the frequency $f_H$, and $\omega_H$ represents the angular frequency at $f_H$ ($\omega_H = 2\pi f_H$).

The tuning is performed in a state that the first surface coil 5, the second surface coil 6, and the electromagnetic decoupling coil 13 are substantially disposed as they are actually disposed. The values may also be obtained by preparing a model for sizes and disposition of the coils and performing numerical computation with an electromagnetic field simulator. The details of the tuning will be described later.

Hereafter, it will be explained that the RF coil unit 25 tuned as described above prevents the electromagnetic coupling between the first surface coil 5 and the second surface coil 6, and functions as the receive RF coil 114.

Figure 4A:
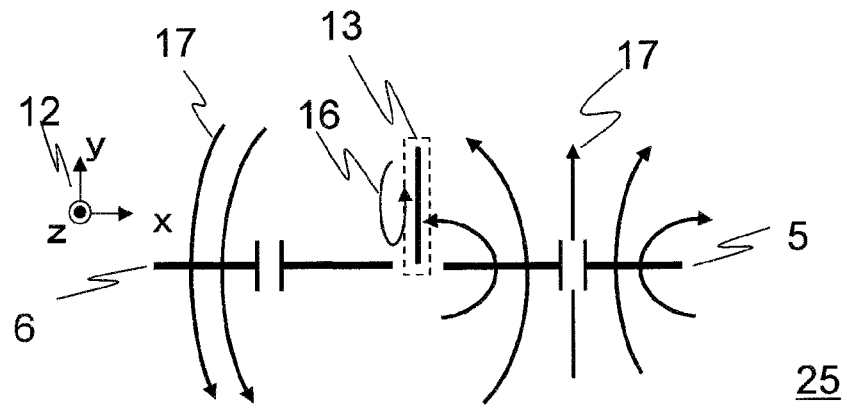
FIG. 4A is a drawing for explaining state of flux interlinkage of a high-frequency magnetic field with a coil in an RF coil unit according to the first embodiment.
Figure 4B:
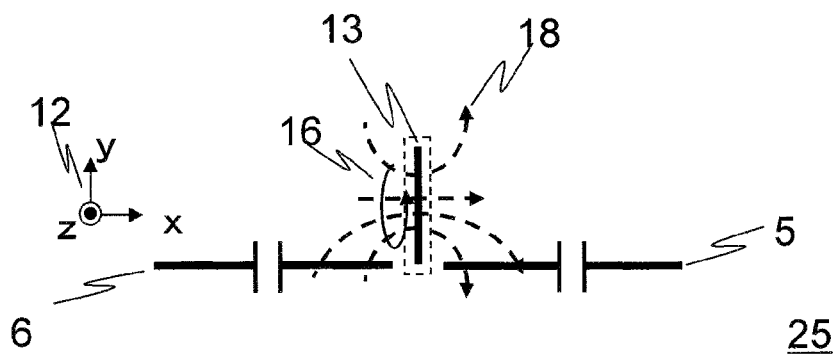
FIG. 4B is a drawing for explaining state of flux interlinkage of a high-frequency magnetic field with a coil in an RF coil unit according to the first embodiment.

First, state of interlinkage of a magnetic flux generated by the first surface coil 5 with the second surface coil 6 in the RF coil unit 25 shown in FIG. 3A, FIG. 3B and FIG. 3C will be explained with reference to FIG. 4A, FIG. 4B and FIG. 4C. As shown in FIG. 4A, when a first high-frequency magnetic field 17 is generated in the first surface coil 5, the fluxes of the first high-frequency magnetic field 17 interlinks with the second surface coil 6 and also interlinks with the loop conductor 9 of the electromagnetic decoupling coil 13. An induced electromotive force is thereby generated to cancel temporal change of the magnetic flux interlinking with the loop conductor 9 of the electromagnetic decoupling coil 13 to induce an inductive current 16.

Figure 5A:
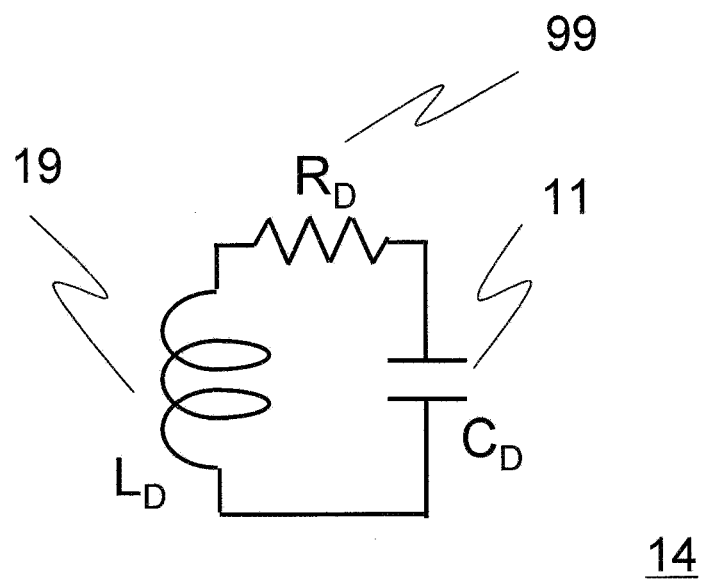
FIG. 5A shows an equivalent circuit of electromagnetic decoupling coils.
Figure 5B:
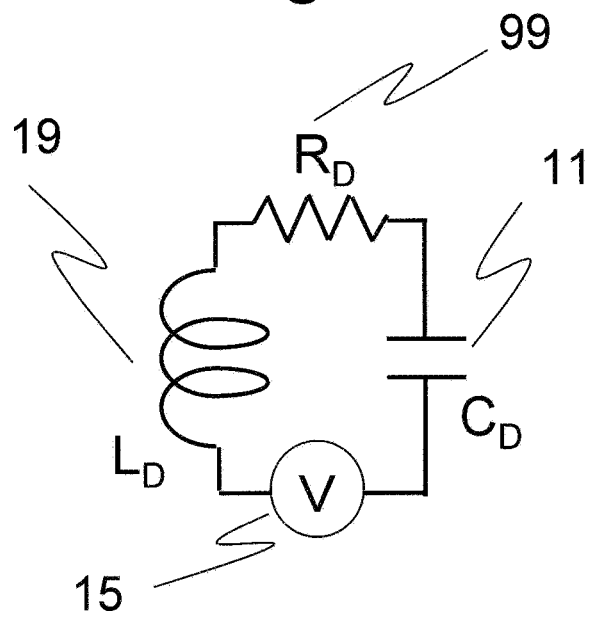
FIG. 5B shows an equivalent circuit of electromagnetic decoupling coils.

The electromagnetic decoupling coil 13 is represented by an equivalent circuit 14 as shown in FIG. 5A, in which an inductance 19 ($L_d$) of the loop conductor 9, the capacitor 11 ($C_d$), equivalent resistance 99 ($R_d$) consisting of resistance of the loop conductor 9 and high-frequency loss are connected with one another. $L_d$, $C_d$ and $R_d$ mentioned in the parentheses are inductance, value of the capacitor and resistance value, respectively. Hereafter, the same shall apply in this specification. When the first high-frequency magnetic field 17 is generated in the first surface coil 5, an induced electromotive force is generated in the electromagnetic decoupling coil 13 along the loop conductor 9. Therefore, the equivalent circuit 14 is represented by a circuit shown in FIG. 5B, in which the induced electromotive force generated in the loop conductor 9 is inserted as an AC source 15. In this case, the equivalent circuit 14 serves as a series resonance circuit having resistance with respect to the AC source 15, and impedance $Z_d$ thereof is represented by the following equation (2).

$$Z_d = R_d + \frac{1 - \omega^2 L_d C_d}{j\omega C_d} \quad (2)$$

In the equation, ω represents an angular frequency (ω=2πf).

Figure 6:
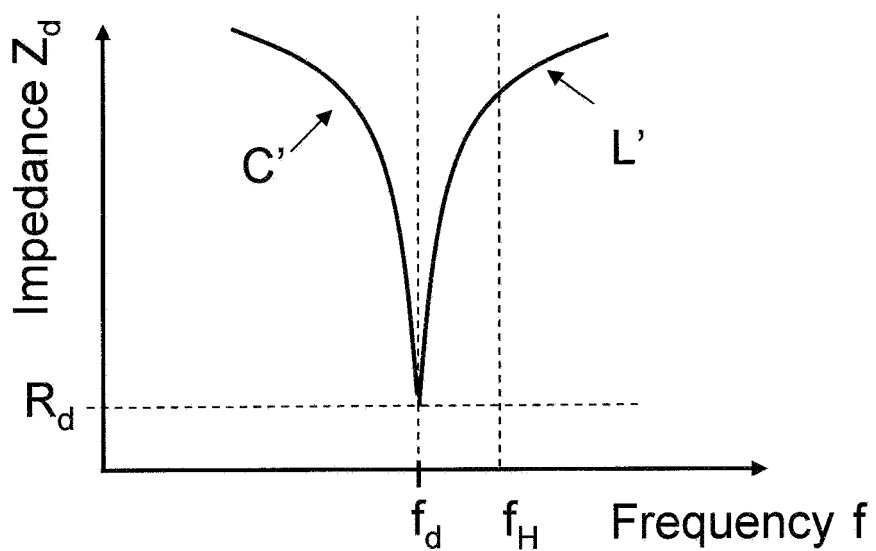
FIG. 6 shows frequency characteristic of impedance of an electromagnetic decoupling coil.

The frequency characteristic of the impedance $Z_d$ is shown in FIG. 6. As shown in this figure, the impedance $Z_d$ of the equivalent circuit 14 tends to increase with the frequency in the frequency region higher than the resonance frequency $f_d$ ($=(L_d C_d)^{-1/2}/2\pi$), and functions as inductive reactance L'. On the other hand, in the frequency region lower than the resonance frequency $f_d$, the impedance $Z_d$ tends to decrease in inverse proportion to the frequency, and functions as capacitative reactance C'.

As described above, the value $C_d$ of the capacitor 11 is tuned so that the resonance frequency $f_d$ of the electromagnetic decoupling coil 13 should become lower than the resonance frequency $f_H$ of the first surface coil 5. Therefore, the equivalent circuit 14 of the electromagnetic decoupling coil 13 functions as inductive reactance at the frequency $f_H$. Accordingly, in the electromagnetic decoupling coil 13, as shown in FIG. 4B, a second high-frequency magnetic field 18 is generated so as to cancel the first high-frequency magnetic field 17.

Figure 4C:
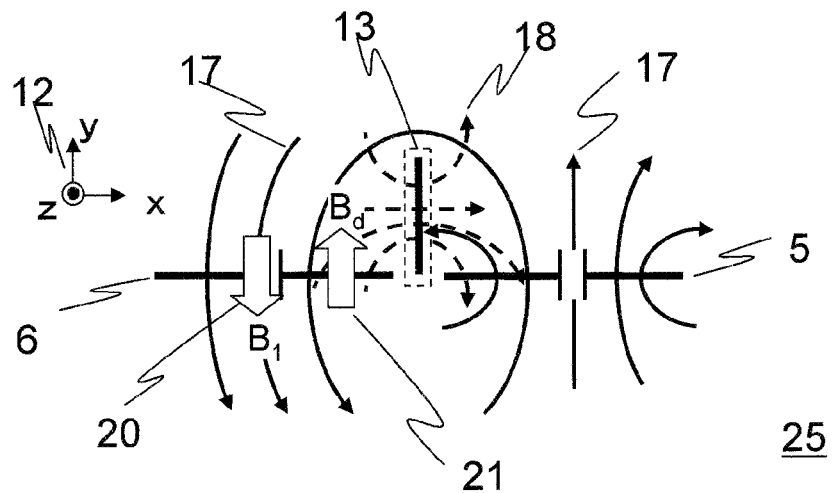
FIG. 4C is a drawing for explaining state of flux interlinkage of a high-frequency magnetic field with a coil in an RF coil unit according to the first embodiment.

As a result, as shown in FIG. 4C, the first high-frequency magnetic field 17 and the second high-frequency magnetic field 18 couple with the second surface coil 6. In this case, the direction 20 of the first high-frequency magnetic field 17 and the direction 21 of the second high-frequency magnetic field 18 are opposite to each other. Therefore, if quantities of the magnetic fluxes of the first high-frequency magnetic field 17 and the second high-frequency magnetic field 18 become equal, both the magnetic fluxes interlinking with the second surface coil 6 are canceled by each other, and the electromagnetic coupling between the first surface coil 5 and the second surface coil 6 is prevented.

Hereafter, it will be explained below that, by tuning the inductance $L_d$ of the loop conductor 9 and the value $C_d$ of the capacitor 11 in the electromagnetic decoupling coil 13, the electromagnetic coupling between the first surface coil 5 and the second surface coil 6 is prevented.

Figure 7:
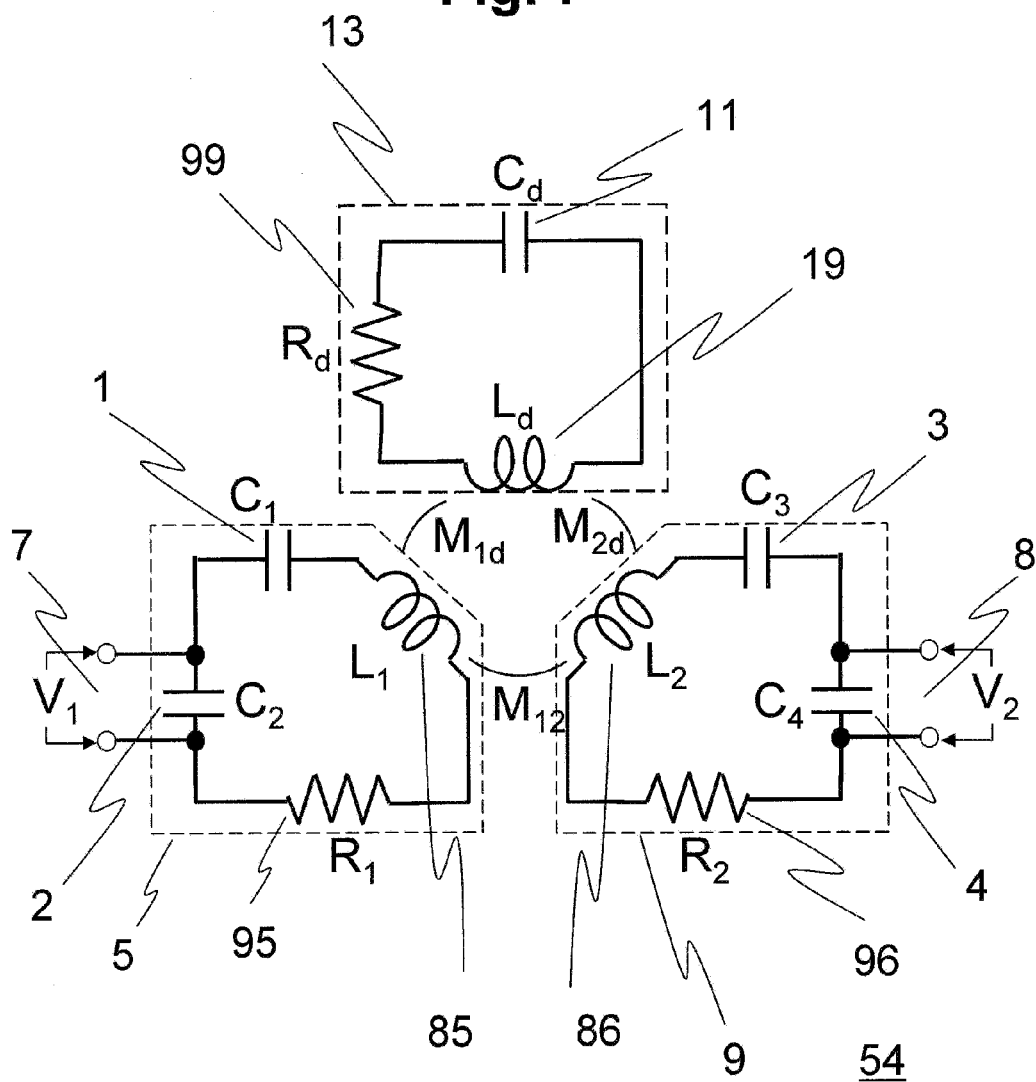
FIG. 7 shows an equivalent circuit of an RF coil unit according to the first embodiment.

An equivalent circuit 54 of the RF coil unit 25 shown in FIG. 3A, FIG. 3B and FIG. 3C is shown in FIG. 7. The first surface coil 5 is represented as a circuit in which the second capacitor 2 ($C_2$) is connected in parallel to a circuit in which equivalent inductance 85 ($L_1$) of the first surface coil 5, the first capacitor 1 ($C_1$), and equivalent resistance 95 ($R_1$) having the resistance component of the coil conductor and loss in the test subject 10 are connected in series, and the first signal lines 7 are connected to both ends of the second capacitor 2.

The second surface coil 6 is represented as a circuit in which the fourth capacitor 4 ($C_4$) is connected in parallel to a circuit in which equivalent inductance 86 ($L_2$) of the second surface coil 6, the third capacitor 3 ($C_3$), and equivalent resistance 96 ($R_2$) having the resistance component of the coil conductor and loss in the test subject 10 are connected in series, and the second signal lines 8 are connected to both ends of the fourth capacitor 4.

The electromagnetic decoupling coil 13 is represented as a circuit in which the inductance 19 of the loop conductor 9 ($L_d$), the capacitor 11 ($C_d$), and the equivalent resistance 99 ($R_d$) having resistance of the loop conductor 9 and high-frequency loss are connected with each other, as in the case shown in FIG. 5A.

Since the first surface coil 5, the second surface coil 6, and the electromagnetic decoupling coil 13 are electromagnetically coupled with one another, there are generated mutual inductance ($M_{12}$) between the first surface coil 5 and the second surface coil 6, mutual inductance ($M_{1d}$) between the first surface coil 5 and the electromagnetic decoupling coil 13, and mutual inductance ($M_{2d}$) between the second surface coil 6 and the electromagnetic decoupling coil 13, respectively. As for the values of the mutual inductances ($M_{12}$, $M_{1d}$, $M_{2d}$), if the directions of the electric currents flowing in the coils ($I_1$, $I_2$, $I_d$) are as shown in FIG. 3A, $M_{2d}$ is a positive value, and $M_{12}$ and $M_{1d}$ are negative values on the basis of positional relationship of the coils.

In this case, high frequency voltage $V_1$ generated in the first signal lines 7 of the first surface coil 5 is represented by the following equation (3), and the high frequency voltage $V_2$ generated in the second signal lines 8 of the second surface coil 6 is represented by the following equation (4).

$$V_1 = \left(R_1 + j\omega L_1 + \frac{1}{j\omega C_1}\right)I_1 + j\omega M_{12} I_2 + j\omega M_{1d} I_d \quad (3)$$

-continued $$V_2 = \left(R_2 + j\omega L_2 + \frac{1}{j\omega C_3}\right)I_2 + j\omega M_{12}I_1 + j\omega M_{2d}I_d \quad (4)$$

In the equations, ω represents an angular frequency (ω=2πf). Further, in the electromagnetic decoupling coil 13, the following equation (5) is held on the basis of the Kirchhoff's law.

$$\left(R_d + j\omega L_d + \frac{1}{j\omega C_d}\right)I_d + j\omega M_{1d}I_1 + j\omega M_{2d}I_2 = 0 \quad (5)$$

Substituting the equation (5) into the equations (3) and (4), respectively, and eliminating $I_d$, the high frequency voltage $V_1$ represented by the equation (3) is represented by the following equation (6), and the high frequency voltage $V_2$ represented by the equation (4) is represented by the following equation (7).

$$V_1 = \left(R_1 + j\omega L_1 + \frac{1}{j\omega C_1} + \frac{\omega^2 M_{1d}^2}{R_d + jX_d}\right)I_1 + j\omega\left(M_{12} - \frac{j\omega M_{1d}M_{2d}}{R_d + jX_d}\right)I_2 \quad (6)$$

$$V_2 = \left(R_2 + j\omega L_2 + \frac{1}{j\omega C_3} + \frac{\omega^2 M_{2d}^2}{R_d + jX_d}\right)I_2 + j\omega\left(M_{12} - \frac{j\omega M_{1d}M_{2d}}{R_d + jX_d}\right)I_1 \quad (7)$$

The second term in the right-hand side of the equation (6) represents a high frequency voltage generated in the first surface coil 5 by electromagnetic coupling with the second surface coil 6, and the second term of the right-hand side of the equation (7) represents a high frequency voltage generated in the second surface coil 6 by electromagnetic coupling with the first surface coil 5. In addition, $X_d$ is represented by the following equation (8).

$$X_d = \omega L_d - \frac{1}{\omega C_d} \quad (8)$$

The ratio of the equivalent resistance $R_d$ and $X_d$ ($R_d/X_d$) is represented by the following equation (9).

$$\frac{R_d}{X_d} = \frac{R_d \cdot \omega C_d}{\omega^2 L_d C_d - 1} = \frac{R_d}{\omega L_d} \cdot \frac{\omega^2 L_d C_d}{\omega^2 L_d C_d - 1} \quad (9)$$

The equivalent resistance $R_d$ is represented as $R_d = \omega_H L_d/Q_H$ by using the Q factor ($Q_H$) at the time of resonating the electromagnetic decoupling coil 13 at a frequency $f_H$. If this is substituted for that variable in the equation (9), each term of the equation (9) at the frequency $f_H$ agrees with the left-hand side of the equation (1). Therefore, from the equation (1), the relation $R_d/X_d < 1/20$ is obtained. Since it can be regarded that $R_d + jX_d \approx jX_d$ in this case, the equation (6) can be transformed into the equation (10), and the equation (7) can be transformed into the equation (11), respectively.

$$V_1 = \left(R_1 + j\omega L_1 + \frac{1}{j\omega C_1} + \frac{\omega^2 M_{1d}^2}{jX_d}\right)I_1 + j\omega\left(M_{12} - \frac{\omega M_{1d}M_{2d}}{X_d}\right)I_2 \quad (10)$$

$$V_2 = \left(R_2 + j\omega L_2 + \frac{1}{j\omega C_3} + \frac{\omega^2 M_{2d}^2}{jX_d}\right)I_2 + j\omega\left(M_{12} - \frac{\omega M_{1d}M_{2d}}{X_d}\right)I_1 \quad (11)$$

As described above, $M_{2d}$ takes a positive value, and $M_{12}$ and $M_{1d}$ take a negative value. Further, $X_d$ takes a positive value, when the resonance frequency ($f_d$) of the electromagnetic decoupling coil 13 is smaller than $f_H$. If the values of the inductance $L_d$ of the loop conductor 9 and the value $C_d$ of the capacitor 11 are tuned so as to satisfy the following equation (12) in such a range that $X_d$ is a positive value, both the second terms in the right-hand sides of the equations (10) and (11) become 0, and thus the high frequency voltage induced in the first surface coil 5 by the electromagnetic coupling with the second surface coil 6 and the high frequency voltage induced in the second surface coil 6 by the electromagnetic coupling with the first surface coil 5 become 0. Therefore, the electromagnetic coupling between the first surface coil 5 and the second surface coil 6 is prevented.

$$X_d = \frac{\omega_H M_{1d} M_{2d}}{M_{12}} \quad (12)$$

As explained above with reference to the equivalent circuit 54, in the RF coil unit 25 of this embodiment, by tuning the inductance $L_d$ of the loop conductor 9 and the value $C_d$ of the capacitor 11 in the electromagnetic decoupling coil 13, the electromagnetic coupling between the first surface coil 5 and the second surface coil 6 can be prevented.

Further, the values of the first capacitor 1 and the second capacitor 2 ($C_1$, $C_2$), and the values of the third capacitor 3 and the fourth capacitor 4 ($C_3$, $C_4$) are tuned so that the first surface coil 5 and second surface coil 6 should resonate at a frequency $f_H$, respectively. Therefore, the first surface coil 5 and the second surface coil 6 are not electromagnetically coupled, and at the same time, they can detect magnetic resonance signals generated from the test subject 10 at the magnetic resonance frequency $f_H$.

As explained above, according to this embodiment, the electromagnetic coupling between the first surface coil 5 and the second surface coil 6 of the RF coil unit 25, which functions as the receive RF coil 114, can be prevented by tuning the inductance $L_d$ of the loop conductor 9 and the value $C_d$ of the capacitor 11 of the electromagnetic decoupling coil 13. In particular, if the value $L_d$ of the inductance of the loop conductor 9 is fixed in advance in a range satisfying the equation (1), it is sufficient to tune only the value $C_d$ of the capacitor 11 so as to satisfy the equation (12). Therefore, the tuning can be attained only by changing the value of one capacitor, thus the tuning becomes easy, and the reproducibility also becomes high. Accordingly, time and effort required for the tuning can be reduced, and the production cost of the RF coil can also be reduced.

In addition, in this embodiment, as shown in FIG. 3B, the electromagnetic decoupling coil 13 is disposed so that a part of the loop conductor 9 should be located in the second plane 23. However, it is sufficient that the electromagnetic decoupling coil 13 is disposed so that the mutual inductance ($M_{12}$) between the first surface coil 5 and the second surface coil 6, the mutual inductance ($M_{1d}$) between the first surface coil 5 and the electromagnetic decoupling coil 13, and the mutual inductance ($M_{2d}$) between the second surface coil 6 and the electromagnetic decoupling coil 13 should satisfy the following equation (13).

$$\frac{M_{1d}M_{2d}}{M_{12}} > 0 \qquad (13)$$

Further, although this embodiment has been explained with reference to an example of using loop coils for the first surface coil 5 and second surface coil 6, the shape of the surface coils is not limited to such a shape. They may be plane-shaped coils that can be disposed in a certain direction with leaving a space between them. An example of modification will be explained below.

Figure 8A:
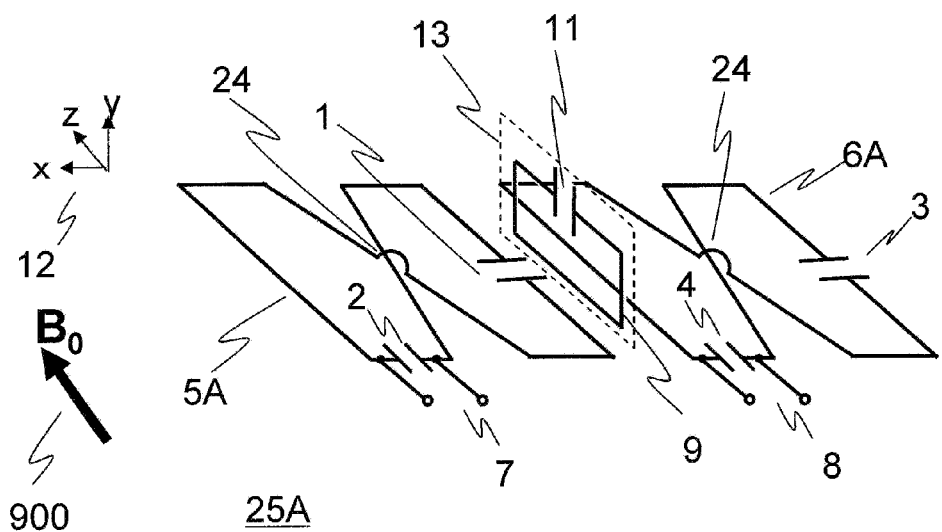
FIG. 8A shows a configuration diagram (a perspective view) of a modification of RF coil unit according to the first embodiment.
Figure 8B:
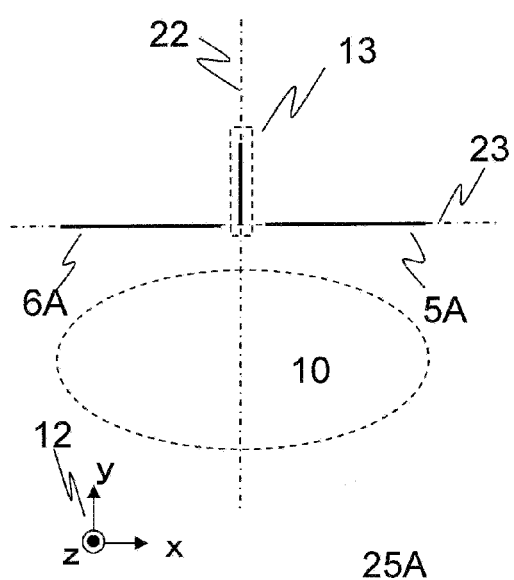
FIG. 8B shows a configuration diagram (a plane view seen in the direction opposing to the z-axis) of a modification of RF coil unit according to the first embodiment.
Figure 8C:
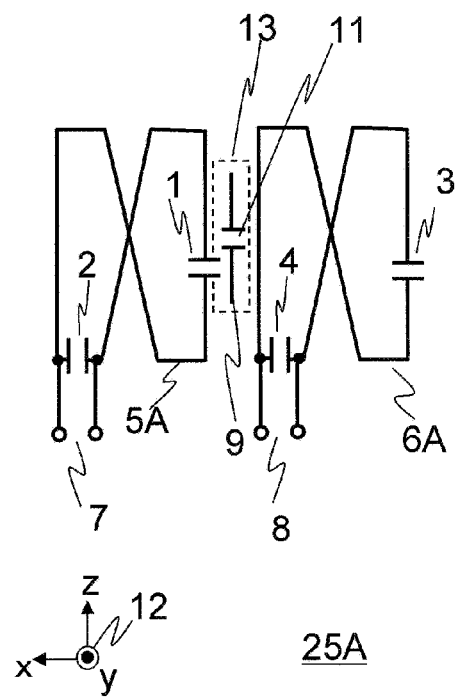
FIG. 8C shows a configuration diagram (a plane view seen in the direction opposing to the y-axis) of a modification of RF coil unit according to the first embodiment.

FIG. 8A, FIG. 8B and FIG. 8C show an RF coil unit 25A, which is a modification of the RF coil unit 25 according to this embodiment. FIG. 8A is a view of the RF coil unit 25A seen from obliquely above, FIG. 8B is a plane view of the RF coil unit 25A seen in the direction opposing to the z-axis, and FIG. 8C is a plane view of the RF coil unit 25A seen in the direction opposing to the y-axis. In this modification, figure-of-eight coils are used for a first surface coil 5A and a second surface coil 6A.

Figure 9A:
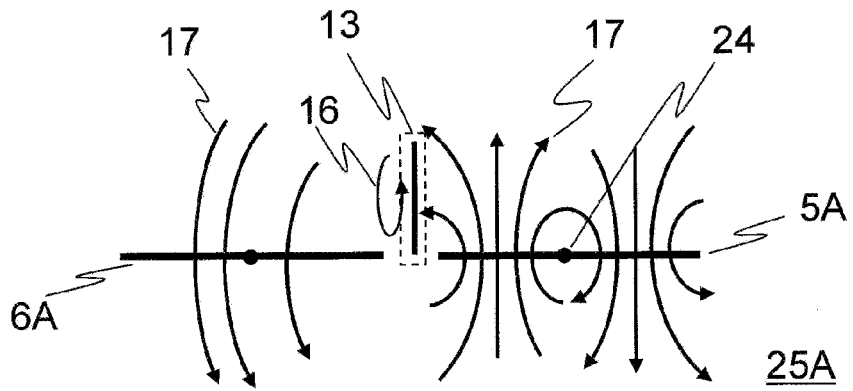
FIG. 9A is a drawing for explaining state of flux interlinkage of a high-frequency magnetic field with a coil in a modification of RF coil unit according to the first embodiment.
Figure 9B:
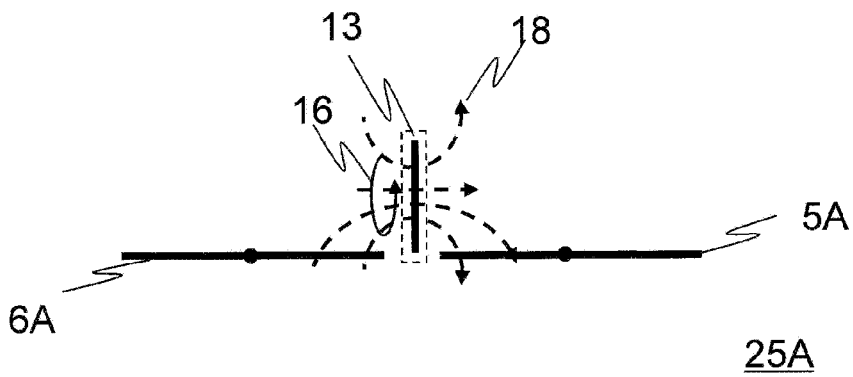
FIG. 9B explaining state of flux interlinkage of a high-frequency magnetic field with a coil in a modification of RF coil unit according to the first embodiment.
Figure 9C:
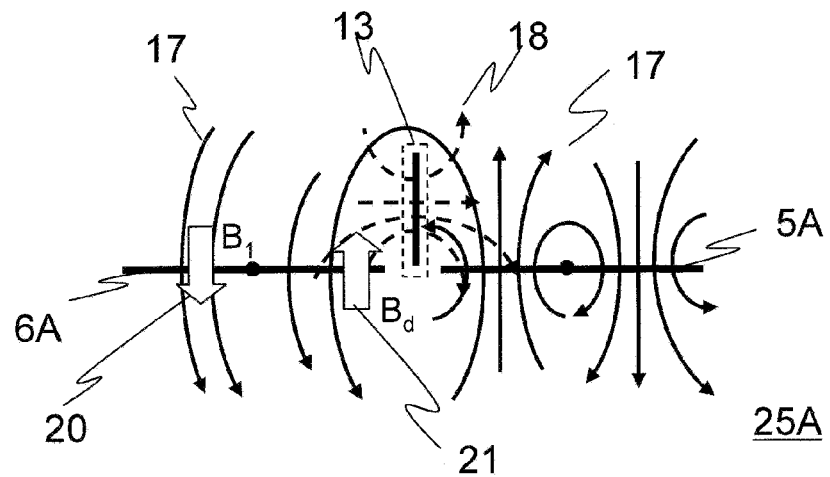
FIG. 9C explaining state of flux interlinkage of a high-frequency magnetic field with a coil in a modification of RF coil unit according to the first embodiment.

State of interlinkage of a magnetic flux generated by the first surface coil 5A with the second surface coil 6A in the RF coil unit 25A will be explained with reference to FIG. 9A, FIG. 9B and FIG. 9C. As shown in FIG. 9A, the first high-frequency magnetic field 17 generated by the first surface coil 5A is distributed so that directions of the magnetic field around the loops on both sides of the cross point of figure-of-eight coil 24 near and remote from the electromagnetic decoupling coil 13 should be inverse to each other. This phenomenon is caused due to the shape of the figure-of-eight coil. In this case, the fluxes of the first high-frequency magnetic field 17 generated by the loop of the first surface coil 5A nearer to the electromagnetic decoupling coil 13 compared with the cross point of figure-of-eight coil 24 mainly interlinks with the electromagnetic decoupling coil 13 and the second surface coil 6A. Therefore, as shown in FIG. 9B, in the electromagnetic decoupling coil 13, the second high-frequency magnetic field 18 is generated so as to cancel the first high-frequency magnetic field 17 coupling with the electromagnetic decoupling coil 13. As a result, as shown in FIG. 9C, the first high-frequency magnetic field 17 and the second high-frequency magnetic field 18 generated by the electromagnetic decoupling coil 13 and induced by the first high-frequency magnetic field 17 couple with the second surface coil 6A. In this case, the direction 20 of the first high-frequency magnetic field and the direction 21 of the second high-frequency magnetic field are opposite to each other. Therefore, also in the case of using the figure-of-eight coils, the electromagnetic coupling of the coils can be prevented by tuning the inductance $L_d$ of the loop conductor 9 and the value $C_d$ of the capacitor 11 as in the case of the RF coil unit 25 shown in FIG. 3A, FIG. 3B and FIG. 3C.

Therefore, in the RF coil unit 25A shown in FIG. 8A, FIG. 8B and FIG. 8C, the electromagnetic coupling between the first surface coil 5A and the second surface coil 6A is prevented. Accordingly, if the first surface coil 5A and the second surface coil 6A are tuned so as to resonate at $f_H$, the RF coil unit 25A provided with these surface coils functions as a receive RF coil 114 for detecting magnetic resonance signals at that frequency, without electromagnetic coupling. The value of $f_H$ is, for example, the magnetic resonance frequency of hydrogen nucleus at three teslas (=128 MHz), or the like.

Further, in this embodiment, either the first surface coil 5 or the second surface coil 6 may be a loop coil, and the other may be a figure-of-eight coil. Further, in the above explanation of this embodiment, a loop coil of one turn is used for the loop conductor 9 of the electromagnetic decoupling coil 13. However, a loop coil of a plurality of turns may also be used for the loop conductor 9.

Hereafter, there will be explained specific methods for tuning the values of the inductance ($L_1$) of the loop conductor and the values of the first capacitor 1 and the second capacitor 2 ($C_1$, $C_2$) in the first surface coil 5, the inductance ($L_2$) of the loop conductor, and the values of the third capacitor 3 and the fourth capacitor 4 ($C_3$, $C_4$) in the second surface coil 6, and the inductance ($L_d$) of the loop conductor 9 and the value ($C_d$) of the capacitor 11 in the electromagnetic decoupling coil 13 of the RF coil unit 25 according to this embodiment and having the aforementioned configuration, and mentioned specific examples of the values. In the following descriptions, explanations will be made with reference to an example where the values are tuned so that the resonation should occur at the magnetic resonance frequency of hydrogen nucleus at a static magnetic field strength of three teslas ($f_H$=128 MHz), and the impedances of the first surface coil 5 and the second surface coil 6 should be 50Ω at $f_H$.

First, sizes of the first surface coil 5 and the second surface coil 6 are determined according to the imaging conditions, and the values of the first capacitor 1 and the second capacitor 2 ($C_1$, $C_2$) and the values of the third capacitor 3 and the fourth capacitor 4 ($C_3$, $C_4$) are tuned so that the first surface coil 5 and the second surface coil 6 should each independently resonate at 128 MHz, and the impedances of both the coils should be 50Ω.

Then, the first surface coil 5 and the second surface coil 6 in which the values of the capacitors are tuned are disposed with a predetermined interval, and the first signal lines 7 and the second signal lines 8 are connected to the first surface coil 5 and the second surface coil 6, respectively. When these coils are disposed, in order to enhance the reproducibility of the positions, it is desirable to dispose both the coils on a bobbin that can fix the coils.

Then, after the value of the capacitor 11 ($C_d$) is tuned so that the resonance frequency of the electromagnetic decoupling coil 13 should be 128 MHz, the Q factor ($Q_H$) of the electromagnetic decoupling coil 13 is measured. After the measurement of the Q factor, the electromagnetic decoupling coil 13 is disposed between the first surface coil 5 and the second surface coil 6. In this case, the value ($C_d$) of the capacitor 11 of the electromagnetic decoupling coil 13 is chosen so that the resonance frequency of the electromagnetic decoupling coil 13 should become lower than 128 MHz. Then, the first signal lines 7 and the second signal lines 8 are connected to two ports of a network analyzer, respectively, and the signal transmission characteristic ($S_{12}$) from the first surface coil 5 to the second surface coil 6 at the frequency of 128 MHz is measured. $S_{12}$ mentioned above is a ratio of signals outputted from one port among those entered from the other port, and a smaller value of $S_{12}$ indicates weaker electromagnetic coupling between the first surface coil 5 and the second surface coil 6. Therefore, the value ($C_d$) of the capacitor 11 is changed so that the value of $S_{12}$ should become smaller. Then, a value of the capacitor 11 providing a value of $S_{12}$ smaller than a predetermined value, or a value providing the minimum electromagnetic coupling between the first surface coil 5 and the second surface coil 6 is determined as the value $C_d$ of the capacitor 11.

After the value $C_d$ of the capacitor 11 is determined, the impedances of the first surface coil 5 and the second surface coil 6 are measured at the frequency of 128 MHz, and the values ($C_1$, $C_2$) of the first capacitor 1 and the second capacitor 2, and the values ($C_3$, $C_4$) of the third capacitor 3 and the fourth capacitor 4 are tuned again. In this case, these values are tuned so that both the coils should resonate at 128 MHz, and the impedances of both the coils should become 50Ω. After the tuning, $S_{12}$ is measured again, and if the electromagnetic coupling changes, the value $C_d$ of the capacitor 11 is tuned again.

After the value $C_d$ of the capacitor 11 is determined, the resonance frequency ($f_d$) of the electromagnetic decoupling coil 13 is measured, and it is confirmed whether the condition defined by the equation (1) is satisfied by using the values of $f_d$ and $Q_H$. When the condition defined by the equation (1) is not satisfied, the aforementioned tuning is repeated by changing size or arrangement of the electromagnetic decoupling coil 13, so that the condition defined by the equation (1) should be satisfied.

The values of the aforementioned elements may also be obtained by calculation using an electromagnetic field simulator. For example, it is supposed that, in the RF coil unit 25 of this embodiment shown in FIG. 3A, FIG. 3B and FIG. 3C, the first surface coil 5 and the second surface coil 6 are square coils having a side of 100 mm, and the electromagnetic decoupling coil 13 is a rectangular coil having a width of 100 mm (length along the z-axis direction shown in FIG. 3A) and a height of 25 mm (length along the y-axis direction shown in FIG. 3A). It is also supposed that the conductor used for each coil consists of a copper wire having a diameter of 4 mm, and the interval between the first surface coil 5 and the second surface coil 6 is 10 mm. The interval referred to here means the distance between the centers of the copper wires of both coils. Further, it is also supposed that a part of the loop conductor 9 of the electromagnetic decoupling coil 13 locating in the second plane 23 is disposed at a position at a distance of 5 mm from the end of the first surface coil 5 on the side adjacent to the second surface coil 6. It is further supposed that the RF coil unit 25 is disposed on a surface of 30×30 cm of a rectangular parallelepiped (30×30×20 cm) showing an electric conductivity of 0.3 S/m and a dielectric constant of 78. The values ($C_1$, $C_2$) of the first capacitor 1 and the second capacitor 2, the values ($C_3$, $C_4$) of the third capacitor 3 and the fourth capacitor 4, and the value ($C_d$) of the capacitor 11 of the electromagnetic decoupling coil 13 obtained by simulation performed with the aforementioned conditions using an electromagnetic field simulator are as follows: $C_1$=6.5 pF, $C_2$=64.0 pF, $C_3$=6.5 pF, $C_4$=64.0 pF, and $C_d$=23.0 pF. In this case, the value of the left-hand side of the equation (1) is calculated to be 0.0097, which satisfies the condition of smaller than 1/20 as the condition defined by the equation (1).

Second Embodiment

Figure 10:
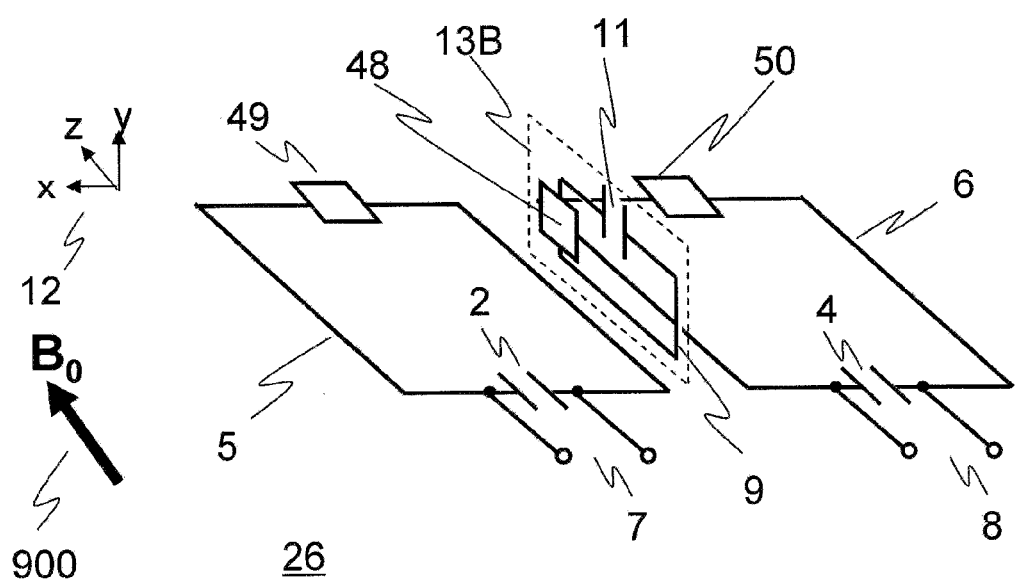
FIG. 10 shows a configuration diagram of an RF coil unit according to the second embodiment.

Next, the second embodiment of the present invention will be explained. Although basic configurations of the MRI device of this embodiment are the same as those of the first embodiment, the configuration of the electromagnetic decoupling coil provided in the RF coil unit is different. FIG. 10 is a drawing for explaining configuration of an RF coil unit 26 of this embodiment. As shown in this drawing, an electromagnetic decoupling coil 13B of the RF coil unit 26 of this embodiment is provided with a decoupling circuit 48 for preventing magnetic coupling with the transmit RF coil 107 in the loop conductor 9. Other configurations are fundamentally the same as those of the RF coil unit 25 of the first embodiment. In addition, also in this embodiment, the direction of the static magnetic field 900 generated by the horizontal magnetic field type magnet 101 is the z-axis direction of the coordinate system 12. Further, the decoupling circuit 49 and the decoupling circuit 50 inserted into the first surface coil 5 and second surface coil 6, respectively, are not shown in FIG. 3A, FIG. 3B and FIG. 3C, but are shown in FIG. 10. The following explanations are made with an assumption that the RF coil unit 26 detects magnetic resonance signals of a frequency $f_H$. Further, it is supposed that, as in the case of the first embodiment, the impedance values of the first surface coil 5 and the second surface coil 6 are tuned to be the same predetermined value K. For example, $f_H$ may be the magnetic resonance frequency of hydrogen nucleus at a static magnetic field strength of three teslas, 128 MHz, and the impedance value K may be 50Ω.

Figure 11A:
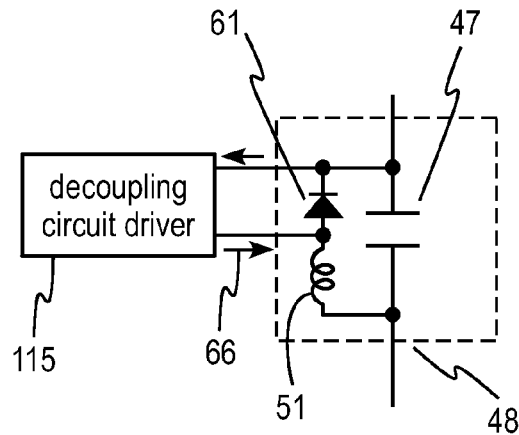
FIG. 11A shows an example of the decoupling circuit according to the second embodiment.
Figure 11B:
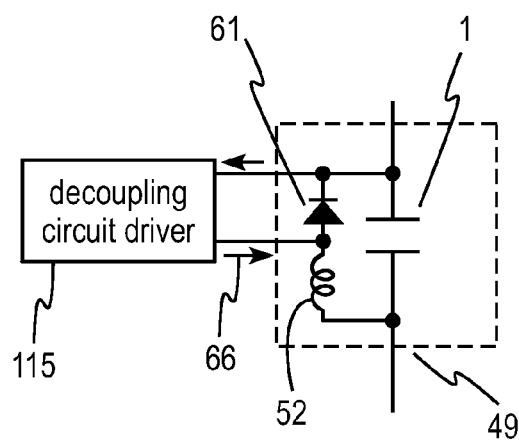
FIG. 11B shows an example of the decoupling circuit according to the second embodiment.
Figure 11C:
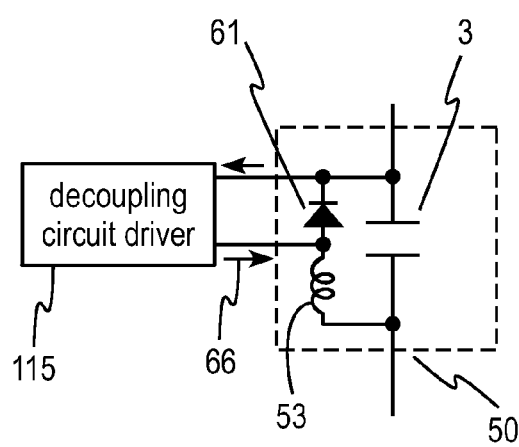
FIG. 11C shows an example of the decoupling circuit according to the second embodiment.

As shown in FIG. 11A, the decoupling circuit 48 is provided with a circuit in which an inductor 51 and a PIN diode 61 are connected in series, and a capacitor 47, which is connected in parallel with the circuit. The PIN diode 61 shows characteristics that it become substantially conductive for a direct current flowing along the forward direction of the diode and larger than a certain level, and ON/OFF is controlled by a direct current. As shown in FIG. 11B, the decoupling circuit 49 is constituted by a first capacitor 1 and a circuit connected with the first capacitor 1 in parallel and having an inductor 52 and the PIN diode 61 connected in series. Further, as shown in FIG. 11C, the decoupling circuit 50 is constituted by a third capacitor 3 and a circuit connected with the third capacitor 3 in parallel and having an inductor 53 and the PIN diode 61 connected in series. In the decoupling circuit 48, the decoupling circuit 49, and the decoupling circuit 50, output terminals of a decoupling circuit driver 115 are connected to both ends of the PIN diode 61.

The inductance $L_1$ of the loop conductor and the values ($C_1$, $C_2$) of the first capacitor 1 and the second capacitor 2 in the first surface coil 5, as well as the inductance $L_2$ of the loop conductor and the values ($C_3$, $C_4$) of the third capacitor 3 and the fourth capacitor 4 in the second surface coil 6 are tuned so that the first surface coil 5 and the second surface coil 6 should resonate at $f_H$, and at that time, impedance values of both the surface coils should be KΩ. The procedure of the tuning is the same as that of the first embodiment.

Further, value $C_{47}$ of a capacitor 47 and inductance $L_{51}$ of an inductor 51 are tuned so that the decoupling circuit 48 should resonate at $f_H$ MHz when the PIN diode 61 is in the ON state, and the value $C_d$ of the capacitor 11 is tuned so that the electromagnetic decoupling coil 13B should prevent the electromagnetic coupling between the first surface coil 5 and the second surface coil 6, when the PIN diode 61 is in the OFF state. The method for the tuning of the value $C_d$ of the capacitor 11 is also the same as that of the first embodiment. The values of the inductors 52 and 53, $L_{52}$ and $L_{53}$, are tuned so that the decoupling circuit 49 and the decoupling circuit 50 should resonate at $f_H$ MHz, when the PIN diode 61 is in the ON state.

Operation of the RF coil unit 26 tuned as described above is explained below. First, when a high-frequency magnetic field is applied to the test subject 10 via the transmit RF coil 107, a control current 66 for preventing magnetic coupling flows into the RF coil unit 26 from the decoupling circuit driver 115. The control current 66 flows into PIN diodes 61 of the decoupling circuits 48, 49 and 50, and the PIN diodes 61 are made to be in the ON state. In this case, since the decoupling circuits 48, 49 and 50 each constitute a parallel resonance circuit, and resonate at $f_H$ MHz, the conductor loops of the first surface coil 5, the second surface coil 6 and the electromagnetic decoupling coil 13B are made to be in a substantially open state. As a result, any electric current hardly flows in the first surface coil 5, the second surface coil 6, and the electromagnetic decoupling coil 13B, and any magnetic field is hardly generated, either. Therefore, magnetic coupling between the transmit RF coil 107 and the RF coil unit 26 is eliminated, and the transmit RF coil 107 irradiates a high-frequency magnetic field containing a main component of $f_H$ MHz on the test subject 10 without shift of the resonance frequency or decrease in the Q factor of the coil due to magnetic coupling.

When RF signals generated by the test subject 10 are received after irradiation of the high-frequency magnetic field, the value of the control current 66 flowing into the PIN diode 61 from the decoupling circuit driver 115 becomes 0. Therefore, the PIN diodes 61 in the RF coil unit 26 are made to be in the OFF state, and the decoupling circuits 48, 49 and 50 operate as the capacitor 47, the first capacitor 1, and the third capacitor 3, respectively. In this case, since the capacitor 11 and the capacitor 47 can be composite and regarded as a single capacitor, the equivalent circuit of the RF coil unit 26 of this embodiment becomes the same as the equivalent circuit of the RF coil unit 25 of the first embodiment. Therefore, the RF coil unit 26 of this embodiment prevents the electromagnetic coupling between the first surface coil 5 and the second surface coil 6, and functions as the receive RF coil 114, as in the case of the RF coil unit 25 of the first embodiment.

In such a case as mentioned above, a decoupling signal is sent from the decoupling circuit driver 115 to the transmit RF coil 107, and the decoupling circuit inserted into the transmit RF coil 107 is made to be in an open state, and thus inactivated. Therefore, when magnetic resonance signals emitted from the test subject 10 are received, magnetic coupling between the RF coil unit 26 and the transmit RF coil 107 is eliminated, and the RF coil unit 26 receives magnetic resonance signals containing main components of $f_H$ MHz without shift of the resonance frequency or decrease in the Q factor of the coil due to magnetic coupling.

As explained above, according to this embodiment, the electromagnetic coupling between the first surface coil 5 and the second surface coil 6 of the RF coil unit 26, which functions as the receive RF coil 114, can be prevented by tuning the inductance $L_d$ of the loop conductor 9, and the value $C_d$ of the capacitor 11. In particular, if the value $L_d$ of the inductance of the loop conductor 9 is fixed beforehand in such a range that the equation (1) should be satisfied, it is sufficient to tune only the value $C_d$ of the capacitor 11 so that the equation (12) should be satisfied, and the tuning can be attained only by changing the value of one capacitor. Therefore, the RF coil unit 26 of this embodiment makes the tuning operation for prevention of electromagnetic coupling easy. Further, the tuning can be attained not only easily, but also with good reproducibility. Therefore, time and effort required for the tuning can be reduced, and the production cost of the RF coil can be reduced. Furthermore, when the transmit RF coil 107 irradiates a high-frequency magnetic field, the decoupling circuit 48 makes the electromagnetic decoupling coil 13B to be in an open state. Therefore, characteristic change of the transmit RF coil 107 due to the magnetic coupling between the transmit RF coil 107 and the electromagnetic decoupling coil 13B can be suppressed, and unnecessary high-frequency magnetic field induced on the electromagnetic decoupling coil 13B by the high-frequency magnetic field can be made sufficiently small.

Figure 12A:
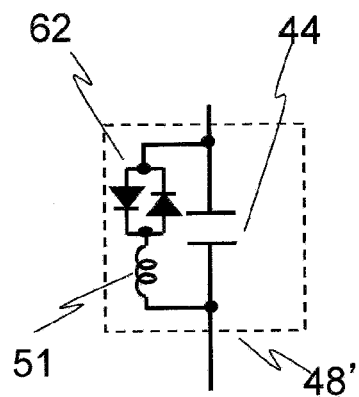
FIG. 12A shows other example of the decoupling circuit according to the second embodiment.
Figure 12B:
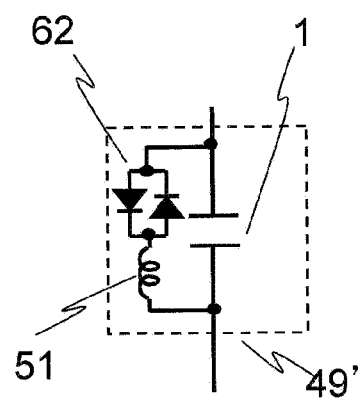
FIG. 12B shows other example of the decoupling circuit according to the second embodiment.
Figure 12C:
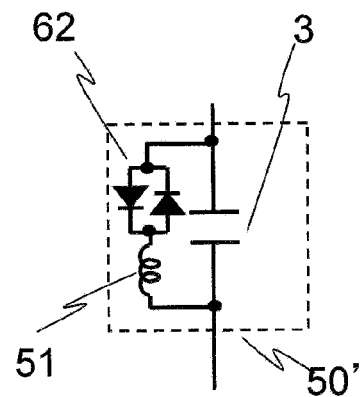
FIG. 12C shows other example of the decoupling circuit according to the second embodiment.

In addition, although this embodiment has been explained with reference to an example where the circuits shown in FIG. 11A, FIG. 11B and FIG. 11C are used as the decoupling circuits 48, 49 and 50, the decoupling circuit is not limited to these. For example, instead of the decoupling circuits 48, 49 and 50 shown in FIG. 11A, FIG. 11B and FIG. 11C, respectively, decoupling circuits 48', 49' and 50' shown in FIG. 12A, FIG. 12B and FIG. 12C, respectively, may be used. These use a cross diode 62 instead of the PIN diode 61 shown in FIG. 11A, FIG. 11B and FIG. 11C. The cross diode 62 is made to be in the ON state by a high-frequency magnetic field applied. Therefore, the control current 66 for preventing magnetic coupling with the transmit coil 107 becomes unnecessary, and thus the decoupling circuit can be constituted more simply.

Third Embodiment

Figure 13A:
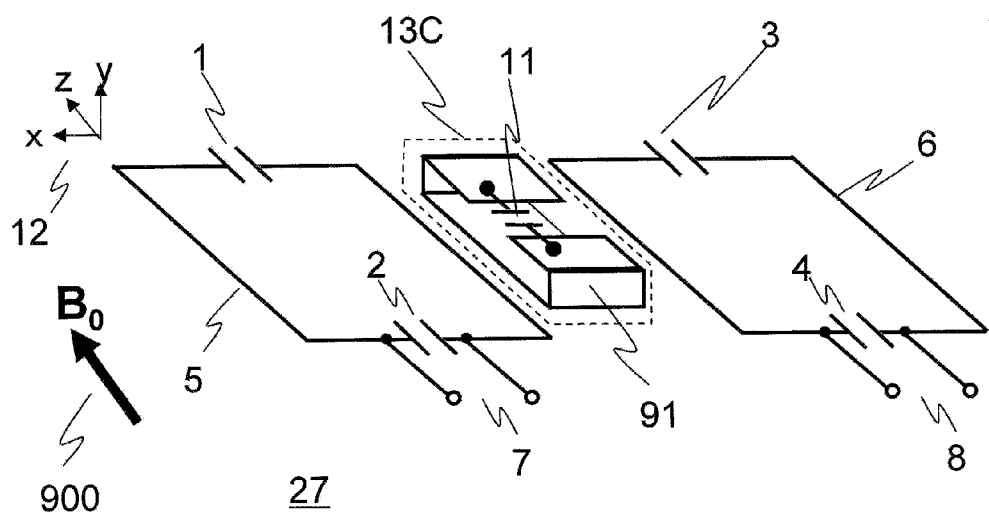
FIG. 13A shows a configuration diagram (a perspective view) of an RF coil unit according to the third embodiment.
Figure 13B:
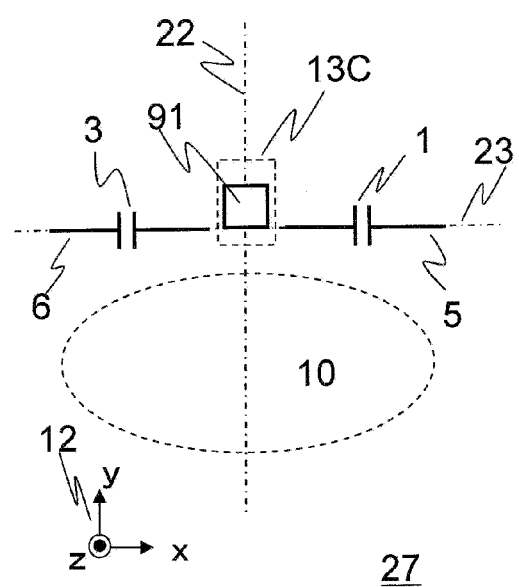
FIG. 13B shows a configuration diagram (a plane view seen in the direction opposing to the z-axis) of an RF coil unit according to the third embodiment.
Figure 13C:
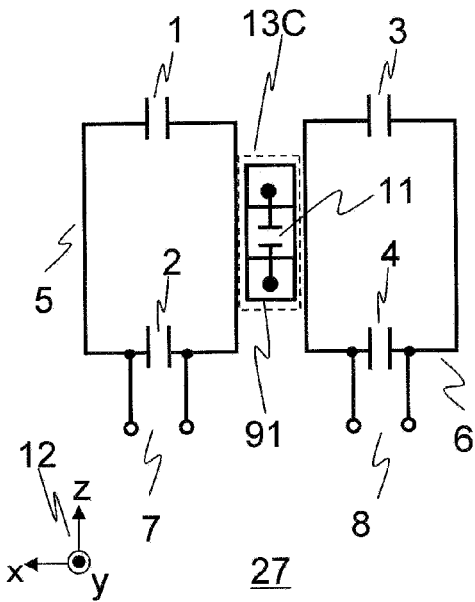
FIG. 13C shows a configuration diagram (a plane view seen in the direction opposing to the y-axis) of an RF coil unit according to the third embodiment.

The third embodiment of the present invention will be explained below. Basic configurations of the MRI device of this embodiment are the same as those of the first embodiment. However, the configurations of the RF coil unit are different. FIG. 13A, FIG. 13B and FIG. 13C include drawings for explaining the configurations of an RF coil unit 27 of this embodiment. As shown in the drawings, a part of the loop conductor 9 of an electromagnetic decoupling coil 13C in the RF coil unit 27 of this embodiment is constituted by a sheet conductive element 91. The sheet conductive element 91 is disposed so that one surface thereof should face the center of the electromagnetic decoupling coil 13C. The other configurations are fundamentally the same as those of the RF coil unit 25 of the first embodiment.

FIG. 13A is a view of the RF coil unit 27 seen from obliquely above, and FIG. 13B is a plane view of the RF coil unit 27 seen in the direction opposing to the z-axis. Further, FIG. 13C is a plane view of the RF coil unit 27 seen in the direction opposing to the y-axis. Also in this embodiment, the direction of the static magnetic field 900 generated by the magnet 101 of the horizontal magnetic field type is the z-axis direction of the coordinate system 12. Explanation will be henceforth made on an assumption that the RF coil unit 27 detects magnetic resonance signals at a frequency of $f_H$. Further, it is supposed that the impedance values of the first surface coil 5 and the second surface coil 6 are tuned to be the same predetermined value K as in the case of the first embodiment. That is, it is supposed that the values of the capacitors ($C_1, C_2, C_3, C_4$) and the inductances ($L_1, L_2$) are tuned so that the resonance frequencies of the first surface coil 5 and the second surface coil 6 should be $f_H$, and the impedance values of the same should be K. For example, $f_H$ can be the magnetic resonance frequency of hydrogen nucleus at a static magnetic field strength of three teslas, 128 MHz, and the impedance value K can be 50Ω. Further, also in this embodiment, it is supposed that the value $C_d$ of the capacitor 11 of the electromagnetic decoupling coil 13C is tuned so that the resonance frequency $f_d$ of the electromagnetic decoupling coil 13C should be lower than the resonance frequency $f_H$ of the surface coils.

Figure 14A:
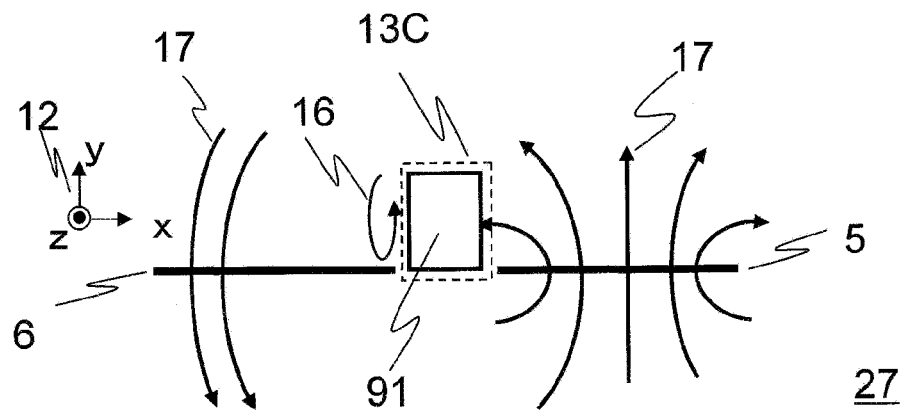
FIG. 14A is a drawing for explaining state of flux interlinkage of a high-frequency magnetic field with a coil in an RF coil unit according to the third embodiment.
Figure 14B:
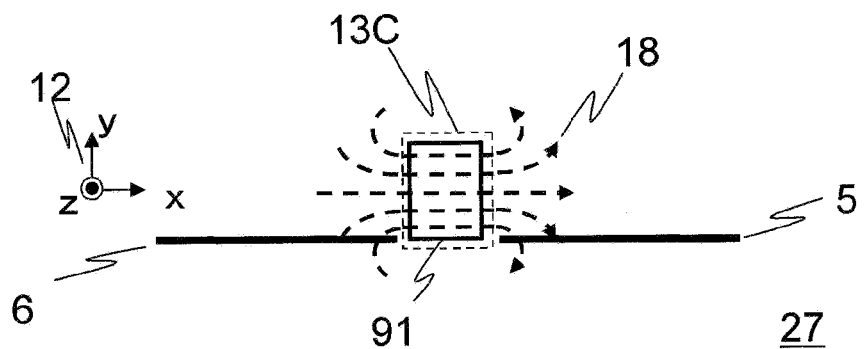
FIG. 14B is a drawing for explaining state of flux interlinkage of a high-frequency magnetic field with a coil in an RF coil unit according to the third embodiment.

State of interlinkage of a magnetic flux generated by the first surface coil 5 with the second surface coil 6 will be explained with reference to FIG. 14A, FIG. 14B and FIG. 14C. First, as shown in FIG. 14A, the fluxes of the first high-frequency magnetic field 17 generated by the first surface coil 5 interlinks with the second surface coil 6 and also interlinks with the electromagnetic decoupling coil 13C. In this case, an induced electromotive force is generated in the sheet conductive element 91 of the electromagnetic decoupling coil 13C to cancel temporal change of the magnetic flux interlinking with the sheet conductive element 91 according to the principle of electromagnetic induction to induce an inductive current 16 in a plane of the sheet conductive element 91. Since the value $C_d$ of the capacitor 11 is tuned so that the resonance frequency $f_d$ of the electromagnetic decoupling coil 13C should be lower than the resonance frequency $f_H$ of the surface coils, the electromagnetic decoupling coil 13C functions as inductive reactance at the frequency $f_H$. Therefore, as shown in FIG. 14B, in the electromagnetic decoupling coil 13C, the second high-frequency magnetic field 18 is generated so as to cancel the first high-frequency magnetic field 17.

Figure 14C:
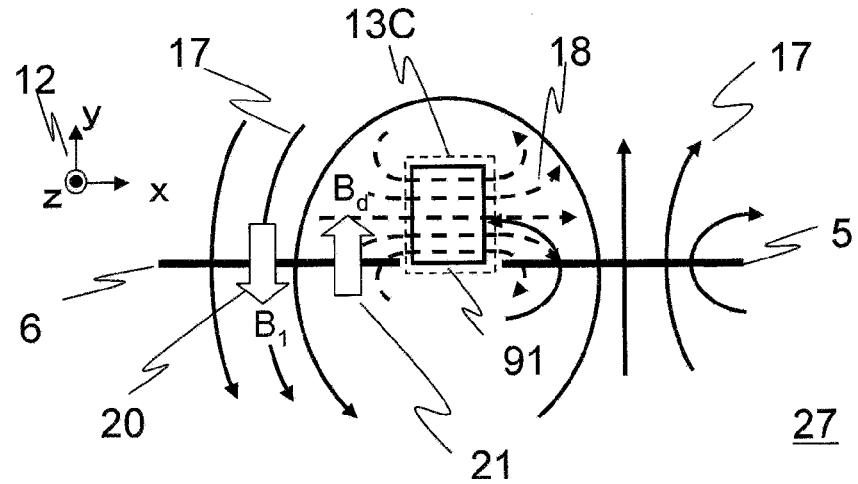
FIG. 14C is a drawing for explaining state of flux interlinkage of a high-frequency magnetic field with a coil in an RF coil unit according to the third embodiment.

As a result, as shown in FIG. 14C, the first high-frequency magnetic field 17 and the second high-frequency magnetic field 18 generated by the electromagnetic decoupling coil 13C induced by the first high-frequency magnetic field 17 couple with the second surface coil 6. In this case, the direction 20 of the first high-frequency magnetic field and the direction 21 of the second high-frequency magnetic field are opposite to each other. Therefore, also in this embodiment, the electromagnetic coupling between the coils is prevented by tuning the inductance $L_d$ of the loop conductor 9 and the value $C_d$ of the capacitor 11 as in the case of the RF coil unit 25 of the first embodiment. Therefore, in the RF coil unit 27 shown in FIG. 13A, FIG. 13B and FIG. 13C, the electromagnetic coupling between the first surface coil 5 and the second surface coil 6 is prevented, and the first surface coil 5 and the second surface coil 6 resonate at the magnetic resonance frequency $f_H$ of the element to be detected, and thus the RF coil unit 27 shown in FIG. 13A, FIG. 13B and FIG. 13C functions as the receive RF coil 114.

As described above, according to this embodiment, the electromagnetic coupling between the first surface coil 5 and the second surface coil 6 of the RF coil unit 27 functioning as the receive RF coil 114 is prevented by tuning the inductance $L_d$ of the loop conductor 9 and the value $C_d$ of the capacitor 11 in the electromagnetic decoupling coil 13C. In particular, if the value $L_d$ of the inductance of the loop conductor 9 is fixed in advance in such a range that the equation (1) should be satisfied, it is sufficient to tune only the value $C_d$ of the capacitor 11 so that the equation (12) should be satisfied. Therefore, the tuning can be attained only by changing the value of one capacitor, therefore the tuning becomes easy, and the reproducibility also becomes high. Accordingly, time and effort required for the tuning can be reduced, and the production cost of the RF coil can also be reduced. Moreover, according to this embodiment, even if the interval between the first surface coil 5 and the second surface coil 6 is expanded, a high-frequency magnetic field induced by one surface coil can be efficiently transfer to the other surface coil by expanding the width of the sheet conductive element 91 correspondingly. Thus, even with a large interval between the first surface coil 5 and the second surface coil 6, the electromagnetic coupling can be effectively prevented.

Fourth Embodiment

Figure 15A:
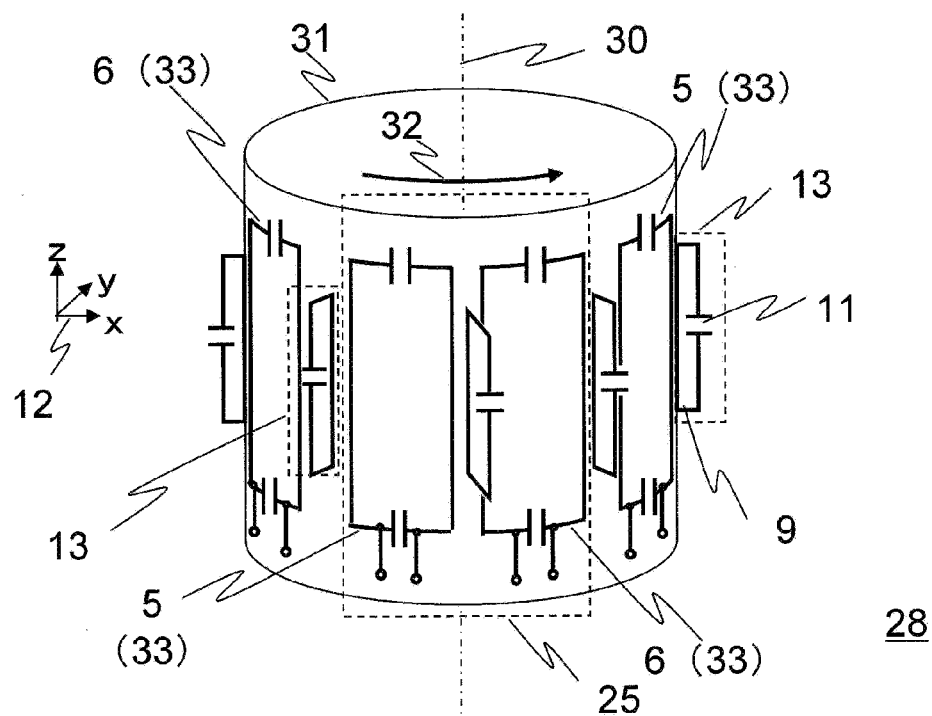
FIG. 15A shows a configuration diagram (a perspective view) of an RF coil unit according to the fourth embodiment.
Figure 15B:
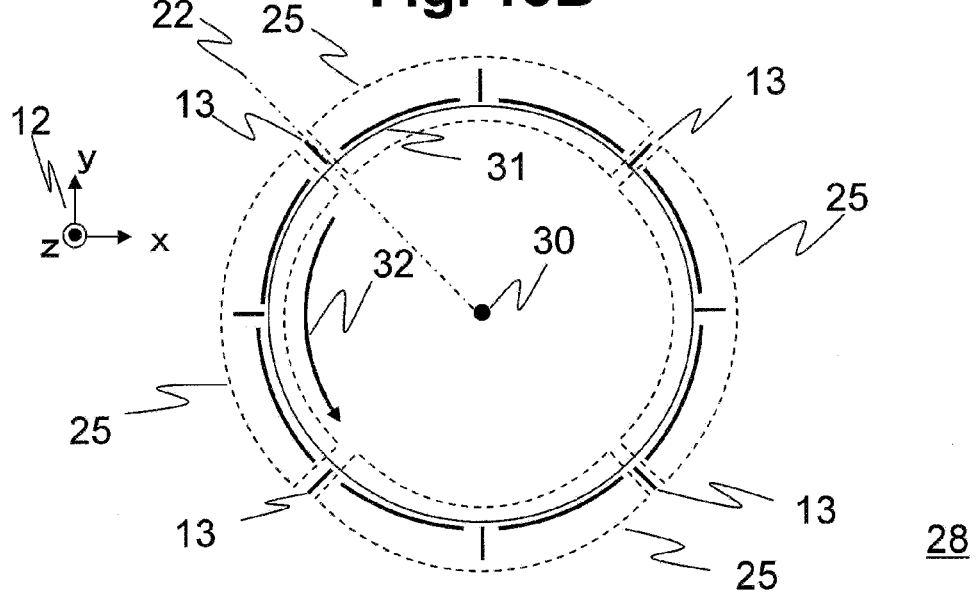
FIG. 15B shows a configuration diagram (a plane view seen in the direction opposing to the z-axis) of an RF coil unit according to the fourth embodiment.

The fourth embodiment of the present invention will be explained below. Basic configurations of the MRI device of this embodiment are the same as those of the first embodiment. However, the configurations of the RF coil unit are different. FIG. 15A and FIG. 15B include drawings for explaining configurations of an RF coil unit 28 of this embodiment. The RF coil unit 28 of this embodiment is configured as an array coil. The RF coil unit is henceforth referred to as an array coil 28. FIG. 15A is a view of the array coil 28 seen from obliquely above, and FIG. 15B is a plane view of the array coil 28 seen in the direction opposing to the z-axis.

The array coil 28 is provided with four of the RF coil units 25 of the first embodiment as shown in FIG. 15B. These RF coil units 25 are disposed along a side of a cylindrical bobbin 31 in the circumferential direction 32 with intervals. In the explanation of this embodiment, when it is not necessary to distinguish the first surface coil 5 and the second surface coil 6 provided in the RF coil unit 25, they are collectively referred to as the surface coils 33. Further, in the array coil 28, the electromagnetic decoupling coil 13 provided in the RF coil unit 25 of the first embodiment is also disposed between the adjacent RF coil units 25, respectively. The electromagnetic decoupling coil 13 disposed in the RF coil unit 25 and the electromagnetic decoupling coil 13 disposed between the RF coil units 25 are disposed over the side of the bobbin 31 so that the first planes 22 in which the electromagnetic decoupling coils substantially locate should include the center axis 30 of the bobbin 31.

In FIG. 15A and FIG. 15B, the decoupling circuits inserted into the surface coils 33 of the RF coil unit 25 are not shown to make the drawings easy to see. Further, inductances and resistances of the surface coils 33 and the electromagnetic decoupling coils 13 themselves are not shown, either. The output of each surface coil 33 constituting the array coil 28 is connected to a balun (balanced-to-unbalanced transformer, not shown) for eliminating common mode noise, and the balun is connected to a preamplifier (not shown). Further, the output of the preamplifier is connected to a plurality of receivers 108 via coaxial cables. For example, in the example of this embodiment, eight surface coils 33 are provided, and therefore they are connected to eight receivers 108.

The inductances of the conductor loops and the values of the capacitors constituting the RF coil units 25 of the array coil 28 of this embodiment are tuned so that electromagnetic coupling between the adjacent surface coils 33 should be prevented, each surface coil 33 should resonate at a magnetic resonance frequency $f_H$ of a predetermined element, and the impedance of each surface coil 33 should be a predetermined value (KΩ) at the magnetic resonance frequency $f_H$ of the predetermined element. Further, the inductance $L_d$ of the loop conductor 9 and the value $C_d$ of the capacitor 11 in the electromagnetic decoupling coil 13 shown in FIG. 15A are tuned so that the resonance frequency $f_d$ of the electromagnetic decoupling coil 13 should be lower than the resonance frequency $f_H$ of the surface coil 33, and electromagnetic coupling between two surface coils 33 adjacent to the electromagnetic decoupling coil 13 should be prevented. The method for tuning the value $C_d$ of the capacitor 11 is the same as that of the first embodiment. For example, $f_H$ can be the magnetic resonance frequency of the hydrogen nucleus at a static magnetic field strength of three teslas, 128 MHz, and the impedance value K can be 50 Ω.

Figure 16A:
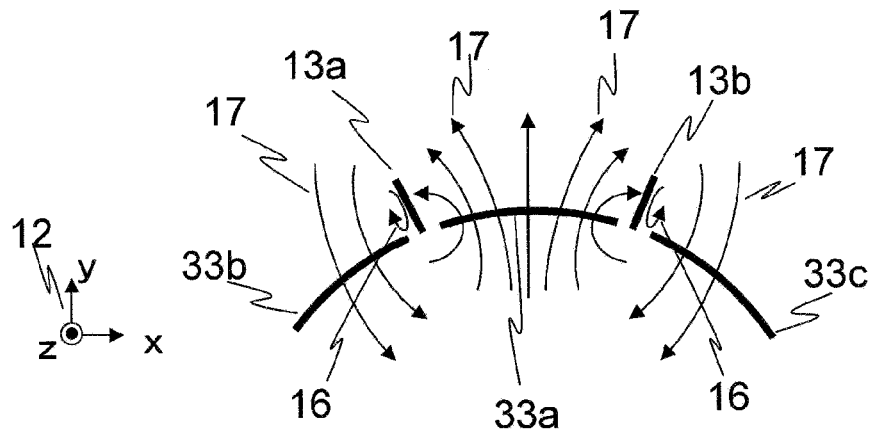
FIG. 16A is a drawing for explaining state of flux interlinkage of a high-frequency magnetic field with a coil in an RF coil unit according to the fourth embodiment.
Figure 16B:
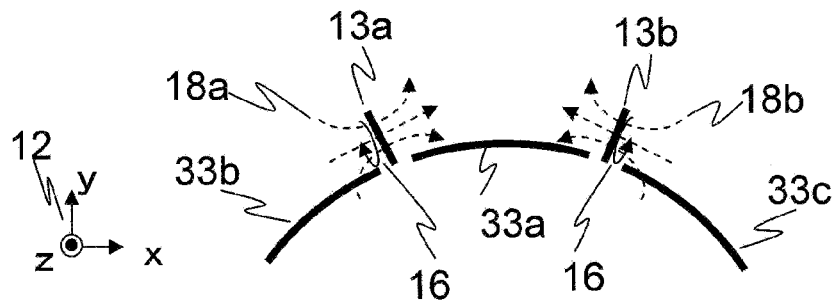
FIG. 16B is a drawing for explaining state of flux interlinkage of a high-frequency magnetic field with a coil in an RF coil unit according to the fourth embodiment.
Figure 16C:
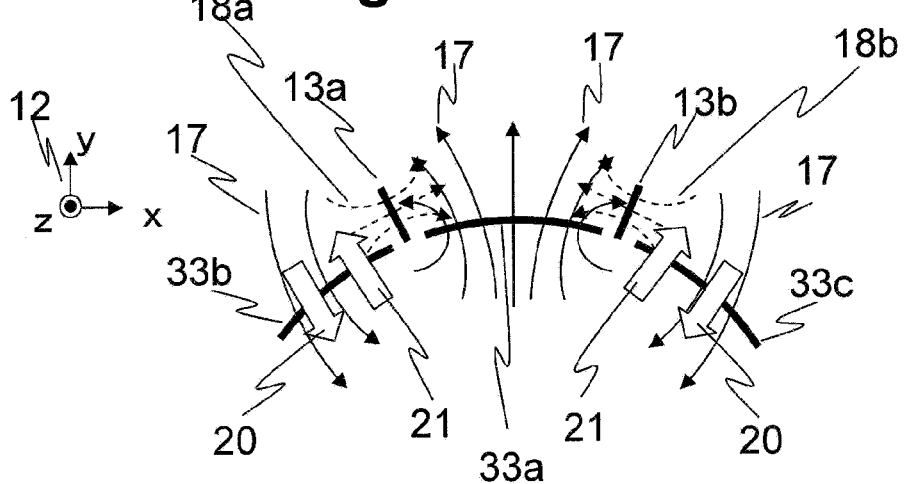
FIG. 16C is a drawing for explaining state of flux interlinkage of a high-frequency magnetic field with a coil in an RF coil unit according to the fourth embodiment.

With reference to three surface coils 33 (first surface coil 33a, second surface coil 33b, and third surface coil 33c) adjacently disposed in the array coil 28 shown in FIG. 15A and FIG. 15B, state of flux interlinkage of magnetic fluxes is explained. FIG. 16A, FIG. 16B and FIG. 16C include drawings for explaining state of flux interlinkage of a first high-frequency magnetic field generated by the first surface coil 33a with the second surface coil 33b and third surface coil 33c. In this explanation, the electromagnetic decoupling coil 13 disposed between the first surface coil 33a and the second surface coil 33b is referred to with the numerical denotation 13a, and the electromagnetic decoupling coil 13 disposed between the first surface coil 33a and the third surface coil 33c is referred with the numerical denotation 13b.

First, as shown in FIG. 16A, the fluxes of the first high-frequency magnetic field 17 induced by the first surface coil 33a interlinks with the second surface coil 33b and third surface coil 33c, and interlinks also with two of the electromagnetic decoupling coils 13a and 13b disposed on both sides of the first surface coil 33a. In this case, an induced electromotive force is generated in the electromagnetic decoupling coils 13a and 13b so as to cancel temporal change of the magnetic flux interlinking with the electromagnetic decoupling coils according to the principle of electromagnetic induction to induce an inductive current 16. Since the value $C_d$ of the capacitor 11 is tuned so that the resonance frequency $f_d$ of each electromagnetic decoupling coil 13 should become lower than the resonance frequency $f_H$ of each surface coil 33, the electromagnetic decoupling coil 13 functions as inductive reactance at the frequency $f_H$. Therefore, as shown in FIG. 16B, in the electromagnetic decoupling coils 13a and 13b, second high-frequency magnetic fields 18a and 18b are generated so as to cancel the first high-frequency magnetic field 17. As a result, as shown in FIG. 16C, the first high-frequency magnetic field 17 and the second high-frequency magnetic field 18a generated by the electromagnetic decoupling coil 13a with induction by the first high-frequency magnetic field 17 couple with the second surface coil 33b. Further, the first high-frequency magnetic field 17 and the second high-frequency magnetic field 18b generated by the electromagnetic decoupling coil 13b with induction by the first high-frequency magnetic field 17 couple with the third surface coil 33c. In this case, the direction 20 of the first high-frequency magnetic field 17 and the direction 21 of the second high-frequency magnetic fields 18a and 18b coupling with both the surface coils 33b and 33c are opposite to each other.

Therefore, by tuning the inductance $L_d$ of the loop conductor 9 and the value $C_d$ of the capacitor 11 in the electromagnetic decoupling coil 13a, as well as the inductance $L_d$ of the loop conductor 9 and the value $C_d$ of the capacitor 11 in the electromagnetic decoupling coil 13b, electromagnetic coupling between the first surface coil 33a and the second surface coil 33b and between the first surface coil 33a and the third surface coil 33c can be prevented.

In the array coil 28 shown in FIG. 15A and FIG. 15B, the surface coils 33 and the electromagnetic decoupling coils 13 are alternately and repeatedly disposed in the circumferential direction 32. Electromagnetic coupling between the surface coils 33 adjacent in the circumferential direction 32 can be prevented by tuning the respective values $C_d$ of the capacitors 11 of the electromagnetic decoupling coils 13. Further, since each surface coil 33 is tuned so as to resonate at $f_H$ MHz, and the impedance should become KΩ, it can detect magnetic resonance signals of the frequency $f_H$. Therefore, in the array coil 28 shown in FIG. 15A and FIG. 15B, electromagnetic coupling between adjacent surface coils 33 is prevented, and each of the eight surface coils 33 functions as the receive RF coil 114 which can detect magnetic resonance signals of the frequency $f_H$.

As explained above, according to this embodiment, electromagnetic coupling of adjacent surface coils 33 in the array coil 28 can be prevented by tuning the inductance $L_d$ of the loop conductor 9 and the value $C_d$ of the capacitor 11 in the electromagnetic decoupling coil 13 disposed between them. In particular, if the value $L_d$ of the inductance of the loop conductor 9 is fixed beforehand in a range satisfying the equation (1), it is sufficient to tune only the value $C_d$ of the capacitor 11 so that the equation (12) should be satisfied. Thus, since the electromagnetic coupling can be prevented by tuning value of only one capacitor as described above, the tuning operation is easy, and reproducibility thereof is high. Further, according to this embodiment, since the surface coils 33 are circumferentially disposed, imaging simultaneously using the eight surface coils 33 is enabled for a test subject placed inside the bobbin 31. That is, imaging with high SN ratio is possible over the whole test subject, and it is especially effective for imaging of head or knee. Further, when the parallel imaging is performed by using the array coil 28 of this embodiment, for example, if phase encoding steps are reduced for the x-axis direction and the y-axis direction of the coordinate system 12 shown in FIG. 15A and FIG. 15B by using the method described in Non-patent document 1, the SN ratio of images to be obtained is improved compared with the case of using surface coils among which adjacent surface coils partially overlap, since intervals are provided between the adjacent surface coils 33.

Although loop coils are used for the surface coils 33 in the above explanation of this embodiment, the shape of the surface coils to be used is not limited to such a shape, and they may consist of planar coils that can be disposed in a predetermined direction with intervals. For example, such figure-of-eight coils as shown in FIG. 8A, FIG. 8B and FIG. 8C may also be used. Further, although eight of the surface coils 33 are used in the above example of this embodiment, the number of the surface coil 33 is not limited to that number. For example, the coils may also be used in a number of 16, 24 or 32.

Furthermore, although the surface coils 33 are disposed in one direction, i.e., the direction 32 along the circumference of the bobbin 31 in the above example of this embodiment, the disposition of the surface coils 33 is not limited to disposition in one direction, and it is sufficient that the surface coils 33 can be disposed with intervals.

Figure 17A:
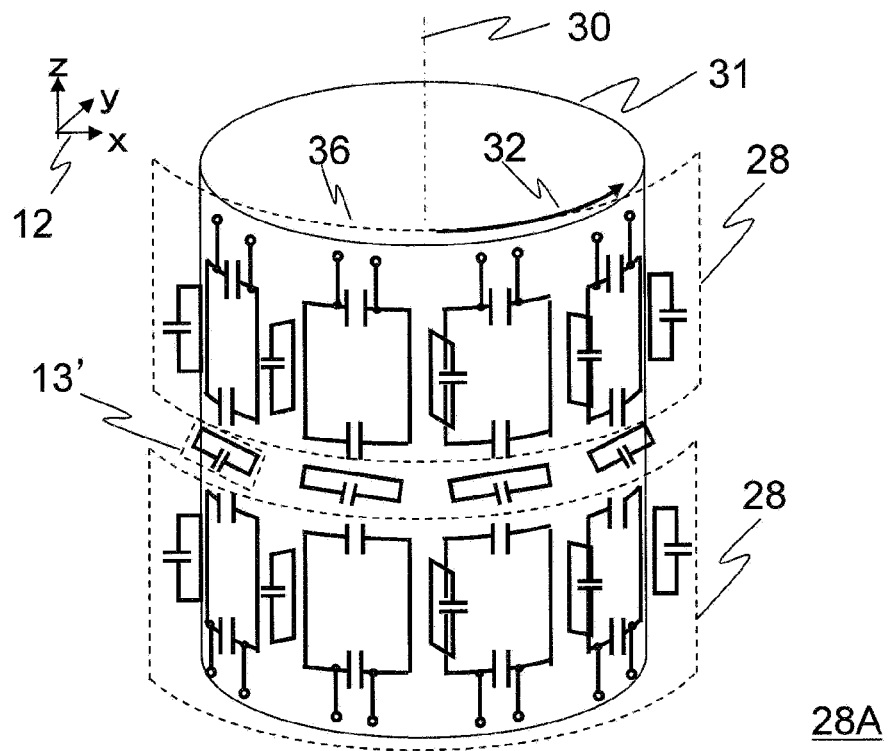
FIG. 17A shows a configuration diagram (a perspective view) of a modification of RF coil unit according to the fourth embodiment.
Figure 17B:
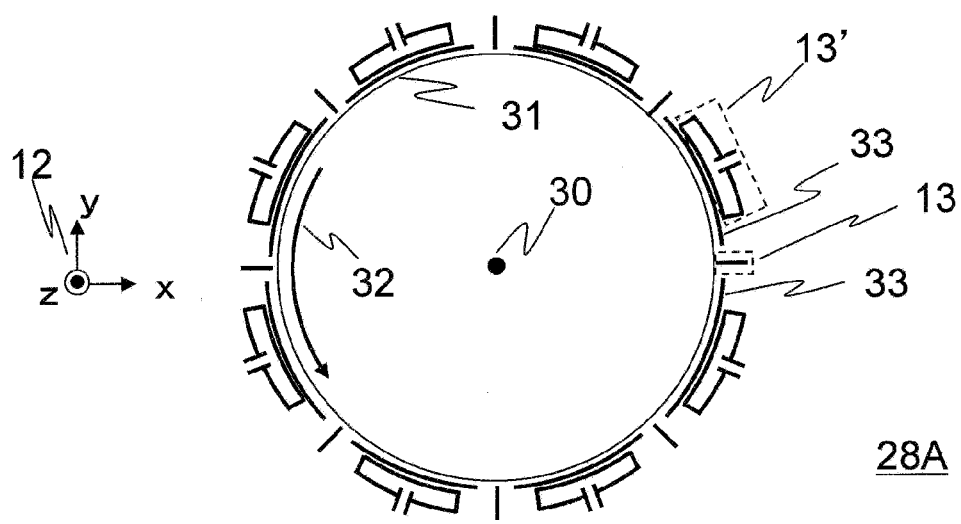
FIG. 17B shows a configuration diagram (a plane view seen in the direction opposing to the z-axis) of a modification of RF coil unit according to the fourth embodiment.

An exemplary modification of the array coil 28 (array coil 28A) is shown in FIG. 17A and FIG. 17B. FIG. 17A is a view of the array coil 28A seen from obliquely above, and FIG. 17B is a plane view of the array coil 28A seen in the direction opposing to the z-axis. As shown in FIG. 17A, the array coil 28A consists of two rows of array coils 28 disposed with an interval for the z-axis direction. For example, the number of the surface coils 33 of each row is supposed to be 8. The surface coils 33 are disposed so that positions of the intervals between the adjacent surface coils in each row should be adjusted for the z-axis direction. Further, an electromagnetic decoupling coil 13' is also disposed between the surface coils 33 adjacent in the z-axis direction. The number of the electromagnetic decoupling coils 13' is 8 so as to correspond to the number of the surface coils 33 in each row.

In this modification, for the circumferential direction 32, electromagnetic coupling between the adjacent surface coils 33 is prevented by the electromagnetic decoupling coil 13 disposed between the surface coils 33 as in the case of the aforementioned embodiments. Further, in this modification, the electromagnetic decoupling coil 13' is disposed between the surface coils 33 in both rows adjacent in the z-axis direction as described above. These positional relationships are the same as those of the RF coil unit 25 shown in FIG. 3A, FIG. 3B and FIG. 3C. Therefore, the electromagnetic coupling between two surface coils 33 adjacent in the z-axis direction is also prevented by the electromagnetic decoupling coil 13'.

Therefore, in the array coil 28A shown in FIG. 17A and FIG. 17B, the electromagnetic coupling between the adjacent surface coils 33 is prevented. Further, all the surface coils 33 simultaneously detect magnetic resonance signals of a desired atomic nucleus (for example, magnetic resonance signals of hydrogen nucleus at three teslas), for which the system is tuned beforehand, and therefore the array coil 28A functions as the receive RF coil 114. In addition, in this modification, the surface coils 33 are disposed with intervals in three kinds of the directions, x, y and z-axis directions. Therefore, in the case of performing the parallel imaging by the method described in Non-patent document 1, even if the phase encoding steps are reduced in any of the x, y and z-axis directions, SN ratio of images to be obtained is improved compared with the case of using coils among which adjacent surface coils partially overlap.

Figure 18A:
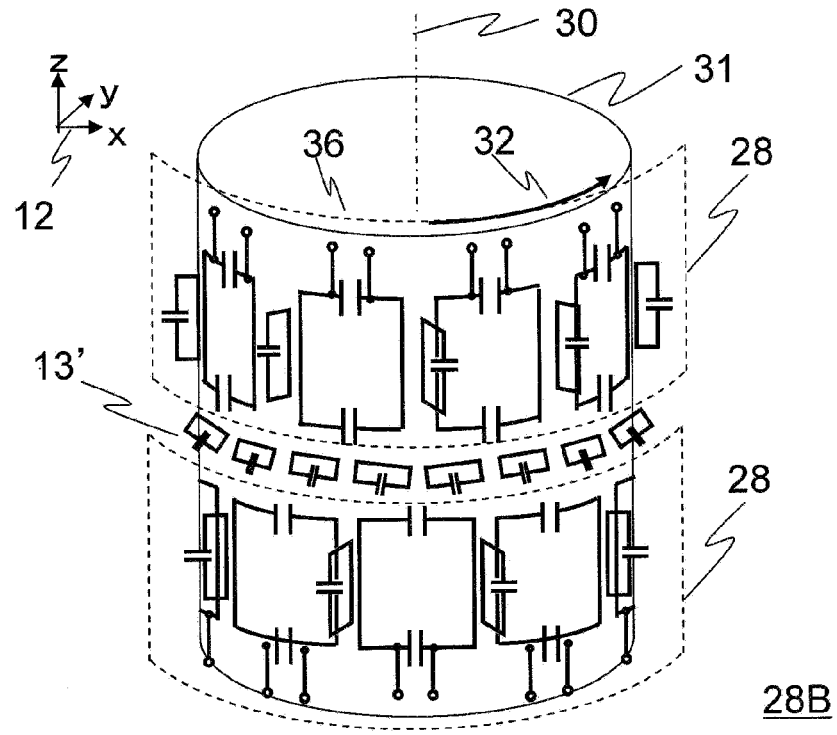
FIG. 18A shows a configuration diagram (a perspective view) of another modification of RF coil unit according to the fourth embodiment.
Figure 18B:
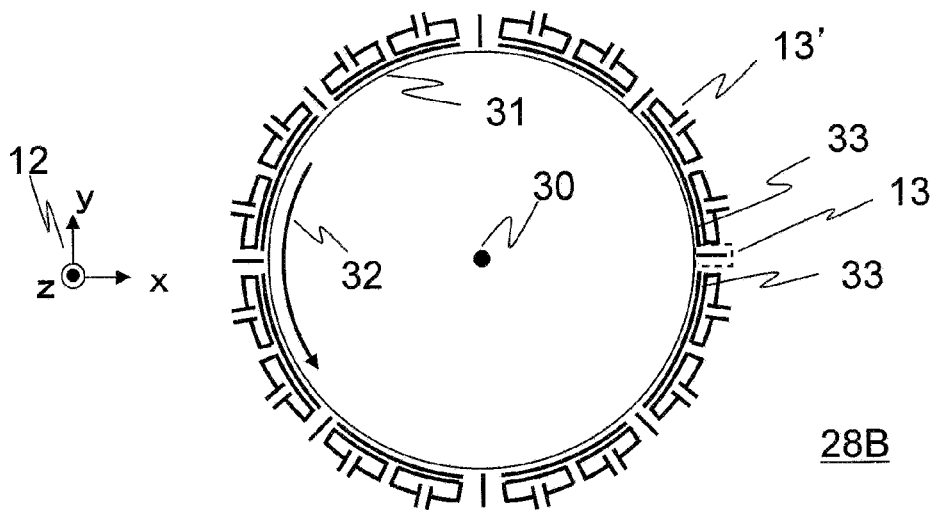
FIG. 18B shows a configuration diagram (a plane view seen in the direction opposing to the z-axis) of another modification of RF coil unit according to the fourth embodiment.

In addition, in this modification, although the positions of the surface coils 33 are adjusted in the circumferential direction of the bobbin 31 and the z-axis direction, the positions of the surface coils 33 may not be adjusted in the z-axis direction, as in an array coil 28B shown in FIG. 18A and FIG. 18B. In this case, the electromagnetic decoupling coils 13' are appropriately disposed in intervals between the adjacent surface coils 33. In this configuration, for the circumferential direction 32, electromagnetic coupling between the adjacent surface coils 33 is prevented by the electromagnetic decoupling coil 13 disposed between the surface coils 33 as in the case of the aforementioned embodiments. Further, between the surface coils 33 of both the rows adjacent in the z-axis direction, the electromagnetic decoupling coils 13' are disposed. These positional relationships are represented by the same equivalent circuit as that of the RF coil unit 25 shown in FIG. 3A, FIG. 13B and FIG. 13C, although the positions of the surface coils 33 are slightly different. Therefore, the electromagnetic coupling between two surface coils 33 adjacent in the z-axis direction is also prevented by the electromagnetic decoupling coils 13'.

Fifth Embodiment

Figure 19A:
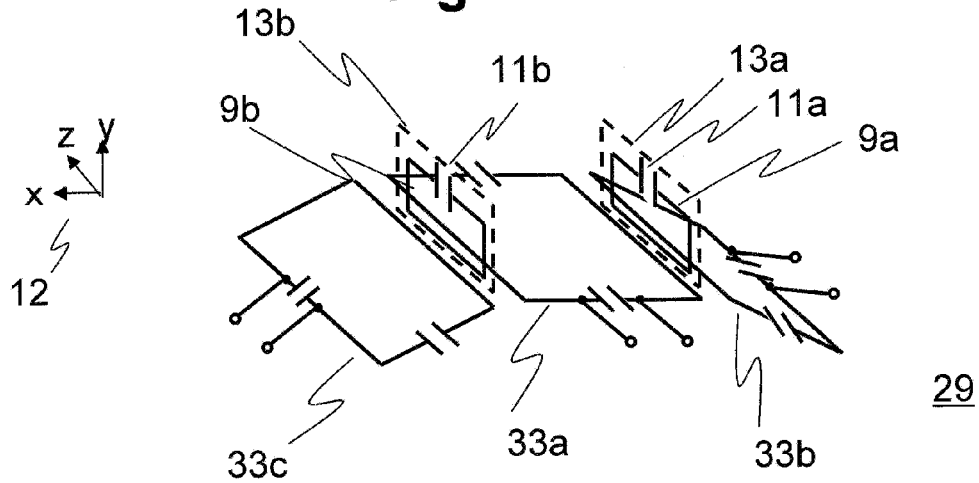
FIG. 19A shows a configuration diagram (a perspective view) of an RF coil unit according to the fifth embodiment.
Figure 19B:
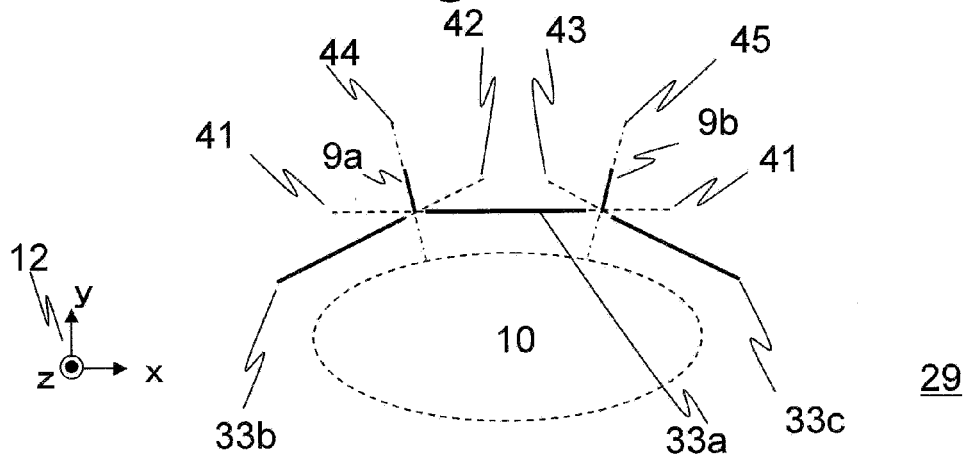
FIG. 19B shows a configuration diagram (a plane view seen in the direction opposing to the z-axis) of an RF coil unit according to the fifth embodiment.
Figure 19C:
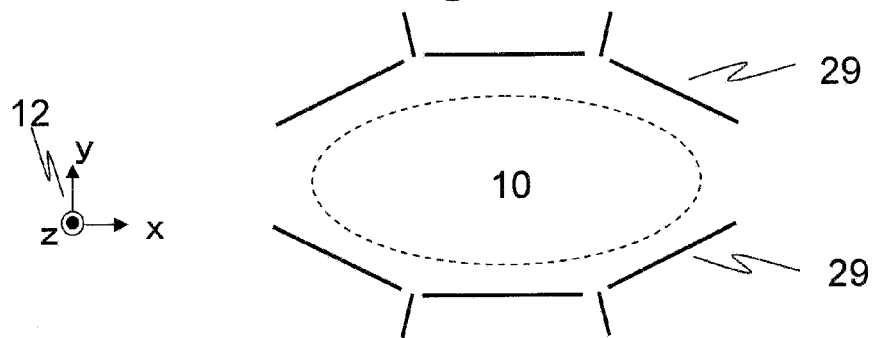
FIG. 19C shows a configuration diagram (a plane view seen in the direction opposing to the z-axis for a case of using two of the RF coil units) of an RF coil unit according to the fifth embodiment.

The fifth embodiment of the present invention will be explained below. Basic configurations of the MRI device of this embodiment are the same as those of the first embodiment. However, in this embodiment, the receive RF coil 114 is constituted by an array coil. FIG. 19A, FIG. 19B and FIG. 19C include drawings for explaining an array coil 29 used as the RF coil 114 of this embodiment. FIG. 19A is a view of the array coil 29 seen from obliquely above, FIG. 19B is a plane view of the array coil 29 seen in the direction opposing to the z-axis, and FIG. 19C is a plane view of a system using two of the array coils 29 seen in the direction opposing to the z-axis.

As shown in FIG. 19A, the array coil 29 is provided with a first surface coil 33a, a second surface coil 33b, a third surface coil 33c, and two electromagnetic decoupling coils 13a and 13b. Hereafter, when the surface coils do not need to be distinguished, they are generically referred to as the surface coils 33, and when the electromagnetic decoupling coils do not need to be distinguished, they are generically referred to as the electromagnetic decoupling coils 13. As in the case of the first surface coil 5 of the first embodiment, the first surface coil 33a, the second surface coil 33b, and the third surface coil 33c each consist of a rectangular conductor loop, a first capacitor 1 and a second capacitor 2 inserted into the conductor loop, and signal lines 7 connected to both ends of the second capacitor.

As shown in FIG. 19B, the first surface coil 33a, the second surface coil 33b, and the third surface coil 33c are disposed with intervals in the x-axis direction of the coordinate system 12, so that the planes of the surface coils 33 should face the test subject 10. In FIG. 19, among the three surface coils 33 disposed in the x-axis direction, the center coil is the first surface coil 33a, and the surface coils 33 on both sides of the first surface coil 33a are the second surface coil 33b and the third surface coil 33c, respectively. Further, two electromagnetic decoupling coils 13a and 13b are disposed between the first surface coil 33a and the second surface coil 33b and between the first surface coil 33a and the third surface coil 33c, respectively.

In this case, as shown in FIG. 19B, the loop conductor 9a constituting the electromagnetic decoupling coil 13a is disposed in a plane 44 which includes the line of intersection of a first plane 41 in which the first surface coil 33a substantially exists and a second plane 42 in which the second surface coil 33b substantially exists. On the other hand, a part of the loop conductors 9b constituting the electromagnetic decoupling coil 13b is disposed in a plane 45 which includes the line of intersection of the first plane 41 in which the first surface coil 33a substantially exists and a third plane 43 in which the third surface coil 33c substantially exists. In this case, the loop conductor 9b is disposed so that the areas thereof on both sides of the line of intersection should be different from each other. Further, the electromagnetic decoupling coil 13a is disposed so that the angle formed by the planes 41 and 44, and the angle formed by the planes 42 and 44 should be substantially the same. Similarly, the electromagnetic decoupling coil 13b is disposed so that the angle formed by the planes 41 and 45, and the angle formed by the planes 43 and 45 should be substantially the same. The term "substantially" used here means that error of the angle caused by production error of the coils may be acceptable.

In the coil array 29 of this embodiment having the aforementioned configuration, inductances of the loop conductors and the values of the capacitors in the surface coils 33 constituting the coil array 29 are each tuned so that electromagnetic coupling between the first surface coil 33a and the second surface coil 33b, and electromagnetic coupling between the first surface coil 33a and the third surface coil 33c should be prevented, the first surface coil 33a, the second surface coil 33b, and the third surface coil 33c should resonate at a magnetic resonance frequency $f_H$ of a predetermined element, and impedances of the first surface coil 33a, the second surface coil 33b, and the third surface coil 33c should be a predetermined value K at a magnetic resonance frequency $f_H$ of the predetermined element. For example, $f_H$ may be the magnetic resonance frequency of hydrogen nucleus at a static magnetic field strength of three teslas, 128 MHz, and the impedances may be 50Ω. Further, the values of the capacitors 11a and 11b of the electromagnetic decoupling coils 13a and 13b are tuned so that the resonance frequency $f_d$ of the electromagnetic decoupling coils 13a and 13b should become lower than the resonance frequency $f_H$ of the surface coils 33.

Figure 20A:
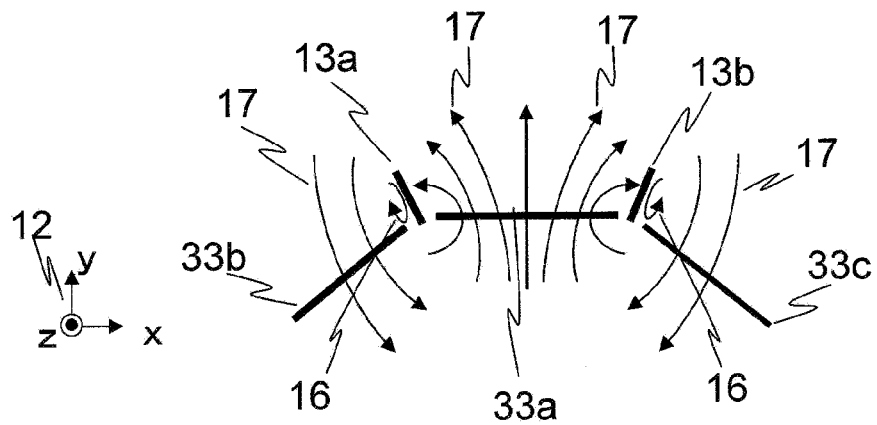
FIG. 20A is a drawing for explaining state of flux interlinkage of a high-frequency magnetic field with a coil in an RF coil unit according to the fifth embodiment.
Figure 20B:
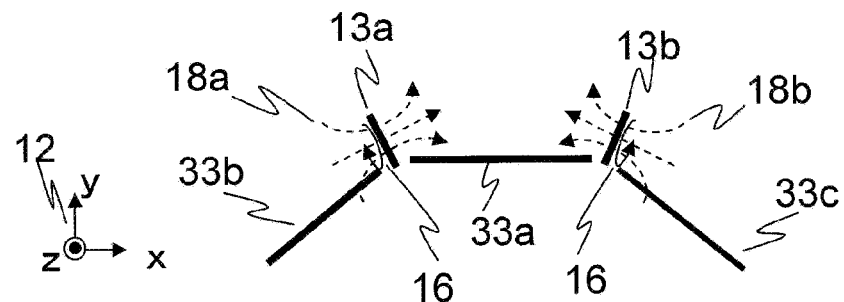
FIG. 20B is a drawing for explaining state of flux interlinkage of a high-frequency magnetic field with a coil in an RF coil unit according to the fifth embodiment.

First, state of interlinkage of a magnetic flux generated by the first surface coil 33a with the second surface coil 33b and the third surface coil 33c is explained with reference to FIG. 20A, FIG. 20B and FIG. 20C. As shown in FIG. 20A, the fluxes of the first high-frequency magnetic field 17 induced by the first surface coil 33a interlinks with the second surface coil 33b and the third surface coil 33c, and interlinks with the two electromagnetic decoupling coils 13a and 13b disposed on both sides of the first surface coil 33a. In this case, an induced electromotive force is generated in the electromagnetic decoupling coils 13a and 13b according to the principle of electromagnetic induction so as to cancel temporal change of the magnetic fluxes interlinking with the electromagnetic decoupling coils, and thus an inductive current 16 is generated. Since the values of the capacitors 11 of the electromagnetic decoupling coils 13a and 13b are tuned so that the resonance frequency $f_d$ of the electromagnetic decoupling coils 13a and 13b should be lower than the resonance frequency $f_H$ of the surface coils 33 as described above, the electromagnetic decoupling coils 13a and 13b operate as inductive reactance at the frequency $f_H$. Therefore, as shown in FIG. 20B, in the electromagnetic decoupling coils 13a and 13b, the second high-frequency magnetic fields 18a and 18b are generated so as to cancel the first high-frequency magnetic field 17.

Figure 20C:
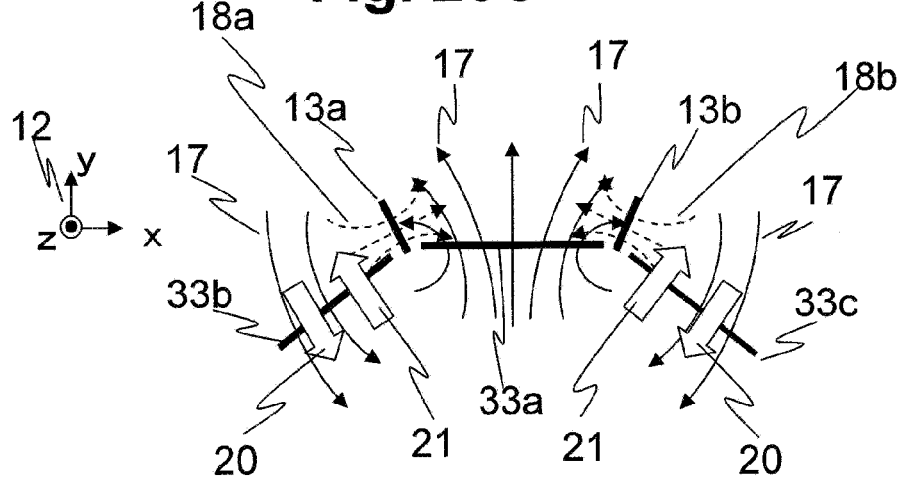
FIG. 20C is a drawing for explaining state of flux interlinkage of a high-frequency magnetic field with a coil in an RF coil unit according to the fifth embodiment.

As a result, as shown in FIG. 20C, the first high-frequency magnetic field 17 and the second high-frequency magnetic field 18a generated by the electromagnetic decoupling coil 13a with induction by the first high-frequency magnetic field 17 couple with the second surface coil 33b, and the first high-frequency magnetic field 17 and the second high-frequency magnetic field 18b generated by the electromagnetic decoupling coil 13b with induction by the first high-frequency magnetic field 17 couple with the third surface coil 33c. In this case, the direction 20 of the first high-frequency magnetic field 17 coupling with the surface coils 33b and 33c and the direction 21 of the second high-frequency magnetic fields 18a and 18b coupling with the surface coils 33b and 33c are opposite to each other. Therefore, by tuning each of the inductance $L_{da}$ of the loop conductor 9a and the value $C_{da}$ of the capacitor 11a in the electromagnetic decoupling coil 13a locating between the first surface coil 33a and the second surface coil 33b, and the inductance $L_{db}$ of the loop conductor 9b and the value $C_{db}$ of the capacitor 11b of the electromagnetic decoupling coil 13b located between the first surface coil 33a and the third surface coil 33c, electromagnetic coupling between the first surface coil 33a and the second surface coil 33b and between the first surface coil 33a and the third surface coil 33c can be prevented. Since the system is tuned so that each of the surface coils 33 should resonate at $f_H$ MHz, and impedances should be KΩ, the array coil 29 of this embodiment prevents electromagnetic coupling between adjacent surface coils, and functions as the receive RF coil 114 for detecting desired magnetic resonance signals.

As described above, according to this embodiment, the electromagnetic coupling between the first surface coil 33a and the second surface coil 33b, and the electromagnetic coupling between the first surface coil 33a and the third surface coil 33c in the array coil 29 which operates as the receive RF coil 114 can be prevented by tuning the inductances ($L_{da}$, $L_{db}$) of the loop conductors 9a and 9b and the values ($C_{da}$, $C_{db}$) of the capacitors 11a and 11b in the electromagnetic decoupling coils 13a and 13b. In particular, if the inductances ($L_{da}$, $L_{db}$) of the loop conductors 9a and 9b are fixed in advance in a range satisfying the equation (1), it is sufficient to tune only the values ($C_{da}$, $C_{db}$) of the capacitors 11a and 11b so that the equation (12) should be satisfied. Therefore, the tuning can be attained only by changing the value of one capacitor in each decoupling coil, therefore the tuning becomes easy, and the reproducibility also becomes high. Furthermore, according to this embodiment, when the parallel imaging is performed by the method described in Non-patent document 1 using two of the array coils 29 disposed on both sides of the test subject 10 as shown in FIG. 19C with reducing phase encoding steps for the y-axis direction of the coordinate system 12 shown in FIG. 19C, SN ratio of images to be obtained is improved compared with the case of using surface coils among which adjacent surface coils partially overlap.

In addition, in the above explanation of this embodiment, the electromagnetic decoupling coils 13 are disposed so that the angles formed by the planes in which the electromagnetic decoupling coils 13 substantially exist and the planes in which three of the surface coils 33 substantially exist should be substantially the same. However, the planes in which the electromagnetic decoupling coils 13 are disposed are not limited to such planes. The angles may be different in such a range that the sensitivity profiles of the surface coils 33 should not change.

Further, in the above explanation of this embodiment, the first surface coil 33a, the second surface coil 33b, and the third surface coil 33c are disposed with intervals in the x-axis direction of the coordinate system 12, as shown in FIG. 19B. However, the direction in which the surface coils 33 are disposed is not limited to one direction, and they may be disposed in any direction so long as the surface coils 33 can be disposed with intervals.

Figure 21A:
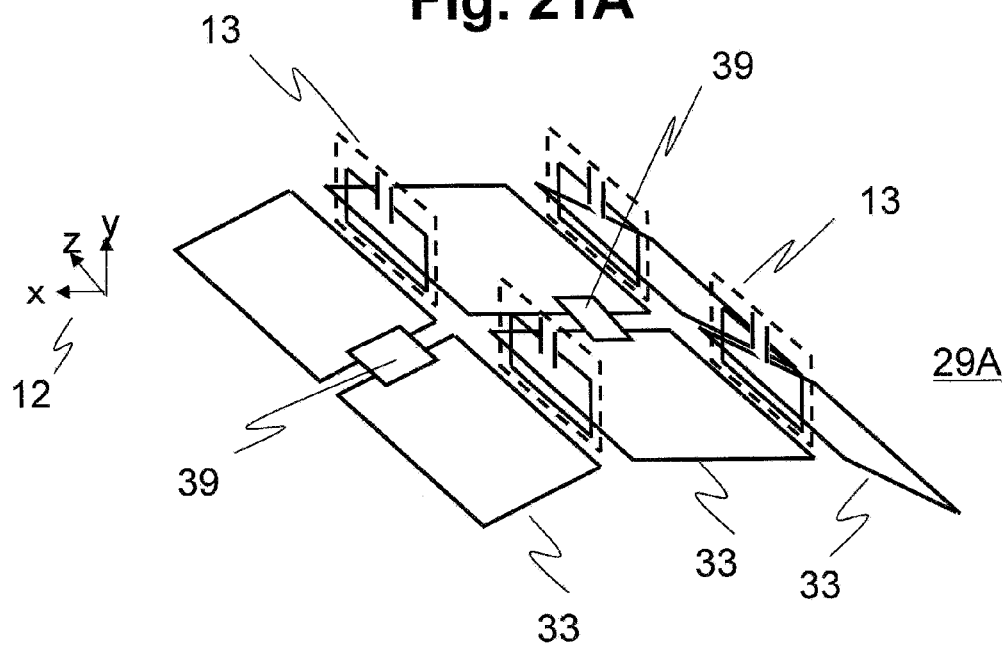
FIG. 21A shows a configuration diagram (a perspective view) of a modification of an RF coil unit according to the fifth embodiment.
Figure 21B:
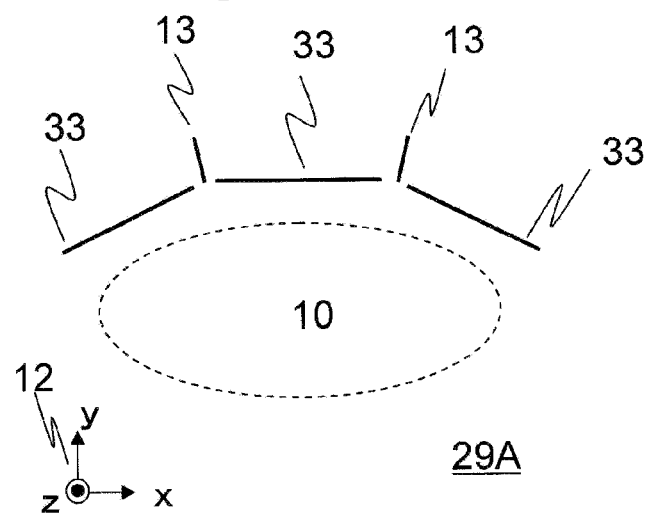
FIG. 21B shows a configuration diagram (a plane view seen in the direction opposing to the z-axis) of a modification of an RF coil unit according to the fifth embodiment.

A modification of the array coil 29 (array coil 29A) is shown in FIG. 21A and FIG. 21B. FIG. 21A is a view of the array coil 29A seen from obliquely above, and FIG. 21B is a plane view of the array coil 29A seen in the direction opposing to the z-axis. As shown in FIG. 21A, this array coil 29A is provided with two rows of the array coils 29 shown in FIG. 19A, FIG. 19B and FIG. 19C disposed with intervals. Further, the surface coils 33 in the rows are disposed so that the positions thereof should be adjusted in the z-axis direction, respectively, and two surface coils 33 adjacent in the z-axis direction are connected with an electromagnetic decoupling circuit 39. The electromagnetic decoupling circuit 39 used here is, for example, the circuit disclosed in Patent document 2, in which two inductors are closely disposed so as to induce electromagnetic coupling.

In this case, the electromagnetic coupling between adjacent coils among the three surface coils 33 disposed with intervals in the x-axis direction of the coordinate system 12 is prevented by the electromagnetic decoupling coil 13, and the electromagnetic coupling of two surface coils 33 disposed with an interval in the z-axis direction of the coordinate system 12 is prevented by the electromagnetic decoupling circuit 39.

Therefore, the array coil 29A shown in FIG. 21A and FIG. 21B prevents the electromagnetic coupling between the adjacent surface coils 33 in the array coil, and simultaneously detects desired magnetic resonance signals such as magnetic resonance signals of hydrogen nuclei at three teslas so as to function as the receive RF coil 114. Further, in this modification, the sensitivity range for the z-axis direction can be expanded. In addition, the electromagnetic decoupling coil 13 may be provided instead of the electromagnetic decoupling circuit 39.

The aforementioned embodiments have been explained with reference to examples using usual capacitors for the first to fourth capacitors 1, 2, 3 and 4 and the capacitor 11. However, trimmer capacitors may be used for them. An example using trimmer capacitors is explained below for the first embodiment as an example.

Figure 22A:
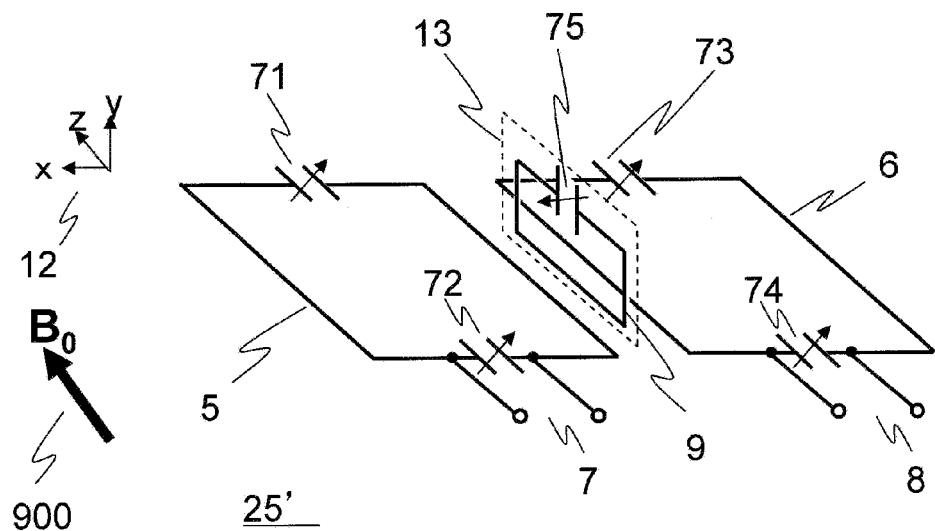
FIG. 22A shows a configuration diagram (a perspective view) of another RF coil unit according to the first embodiment.
Figure 22B:
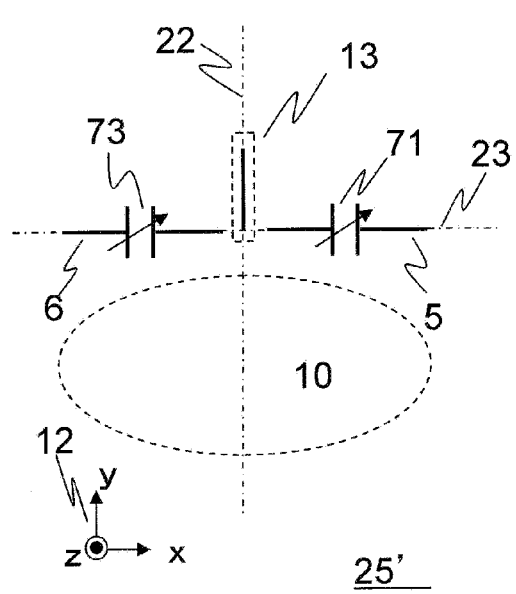
FIG. 22B shows a configuration diagram (a plane view seen in the direction opposing to the z-axis) of another RF coil unit according to the first embodiment.
Figure 22C:
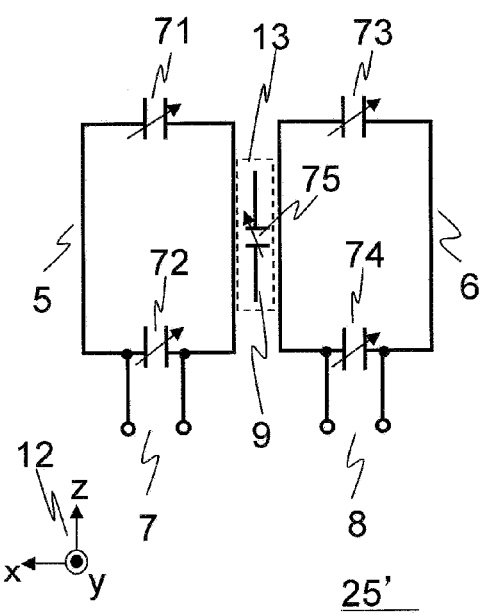
FIG. 22C shows a configuration diagram (a plane view seen in the direction opposing to the y-axis) of another RF coil unit according to the first embodiment.

FIG. 22A, FIG. 22B and FIG. 22C include drawings for explaining configurations of an RF coil unit 25' corresponding to the RF coil unit 25 of the first embodiment in which the first to fourth capacitors 1, 2, 3 and 4 and the capacitor 11 are replaced with trimmer capacitors. FIG. 22A is a view of the RF coil unit 25' seen from obliquely above, FIG. 22B is a plane view of the RF coil unit 25' seen in the direction opposing to the z-axis, and FIG. 22C is a plane view of the RF coil unit 25' seen in the direction opposing to the y-axis. As shown in these drawings, in the RF coil unit 25', the first capacitor 1, the second capacitor 2, the third capacitor 3, and the fourth capacitor 4 are replaced with a first trimmer capacitor 71, a second trimmer capacitor 72, a third trimmer capacitor 73, and a fourth trimmer capacitor 74, respectively, and the capacitor 11 is replaced with a fifth trimmer capacitor 75.

As described above, the resonance frequencies and impedances of the first surface coil 5 and the second surface coil 6 are made to be desired values (for example, resonance frequency of 128 MHz, impedance of 50Ω) by tuning the value $C_1$ of the first capacitor 1 (71), the value $C_2$ of the second capacitor 2 (72), the value $C_3$ of the third capacitor 3 (73), and the value $C_4$ of the fourth capacitor 4 (74). Further, prevention of the electromagnetic coupling between both surface coils is realized by tuning the value $C_d$ of the capacitor 11 (75) in the electromagnetic decoupling coil 13. Furthermore, signal transmission characteristics ($S_{12}$) from the first surface coil 5 to the second surface coil 6 are measured by using a network analyzer, and with reference to the results of the measurement, the values of the capacitors are tuned again.

In the RF coil unit 25 of the first embodiment, the function as the receive RF coil and prevention of the electromagnetic coupling are realized by tuning the values of the capacitors as described above. In this modification, since the capacitors are trimmer capacitors, the values of the capacitors can be changed without removal and attachment of the capacitors. Therefore, the aforementioned tuning can be more easily performed. Accordingly, time and effort required for the tuning can be reduced, and electromagnetic coupling between adjacent surface coils can be easily prevented.

The aforementioned embodiments are explained with reference to examples using the coils according to the present invention as the receive RF coils. However, the coil according to the present invention can also be used as a transmit RF coil or a transmit and receive RF coil.

An example of use of the RF coil unit 25 used in the first embodiment as a transmit RF coil 107 will be explained below. The basic configurations of MRI device 100 of this embodiment are the same as those of the first embodiment. Further, the structure of the RF coil unit 25 and the tuning method of the values of the elements are the same as those of the first embodiment. The differences from the first embodiment are explained below.

When the RF coil unit 25 shown in FIG. 3A, FIG. 3B and FIG. 3C is used as the transmit RF coil 107, the first signal lines 7 and the second signal lines 8 shown in FIG. 3A, FIG. 3B and FIG. 3C are each connected to a balun (balanced-to-unbalanced transformer, not shown) for eliminating common node noise, and the balun is connected to a transmit power amplifier (not shown). Furthermore, output of the transmit power amplifier is connected to a high-frequency magnetic field generator 106 via a coaxial cable.

As in the case of the first embodiment, there is not shown the decoupling circuit for preventing electromagnetic coupling with the receive RF coil 114, which is provided in each of the first surface coil 5 and second surface coil 6. Further, when there are a plurality of the transmit RF coils 107, the high-frequency magnetic field generator 106 is connected to each of the transmit RF coils 107. Depending on use, a surface coil, a birdcage coil, or the RF coil unit 25 is used for the receive RF coil 114.

It will be explained below that the RF coil unit 25 tuned as described above prevents electromagnetic coupling between the first surface coil 5 and the second surface coil 6, and functions as the transmit RF coil 107.

A high-frequency magnetic field sent from the high-frequency magnetic field generator 106 is amplified by the transmit power amplifier, and via the balun, applied to each of the first signal lines 7 and the second signal lines 8 of the RF coil unit 25. According to the reciprocal theory, the state of the electromagnetic coupling between the first surface coil 5 and the second surface coil 6 observed when a high-frequency magnetic field is applied to the RF coil unit 25 is the same as that observed when the RF coil unit 25 detects the high-frequency magnetic field. Therefore, as in the case of the first embodiment, by tuning the inductance $L_d$ of the loop conductor 9 and the value $C_d$ of the capacitor 11 in the electromagnetic decoupling coil 13 of the RF coil unit 25 shown in FIG. 3A, FIG. 3B and FIG. 3C, electromagnetic coupling between the first surface coil 5 and the second surface coil 6 can be prevented. Therefore, a high-frequency magnetic field is applied to the test subject 10, while the RF coil unit 25 does not suffer from electromagnetic coupling.

As explained above, according to this embodiment, the electromagnetic coupling between the first surface coil 5 and the second surface coil 6 of the RF coil unit 25 which functions as the transmit RF coil 107 can be prevented by tuning the inductance $L_d$ of the loop conductor 9 and the value $C_d$ of the capacitor 11 in the electromagnetic decoupling coil 13. In particular, if the inductance $L_d$ of the loop conductor 9 is fixed in advance, it is sufficient to tune only the value $C_d$ of the capacitor 11 so as to satisfying the equation (12). Therefore, the tuning can be attained only by changing value of one capacitor, thus the tuning is easy, and reproducibility thereof is also high. Accordingly, time and effort required for the tuning can be reduced, and the production cost of the RF coil can be reduced.

Figure 23:
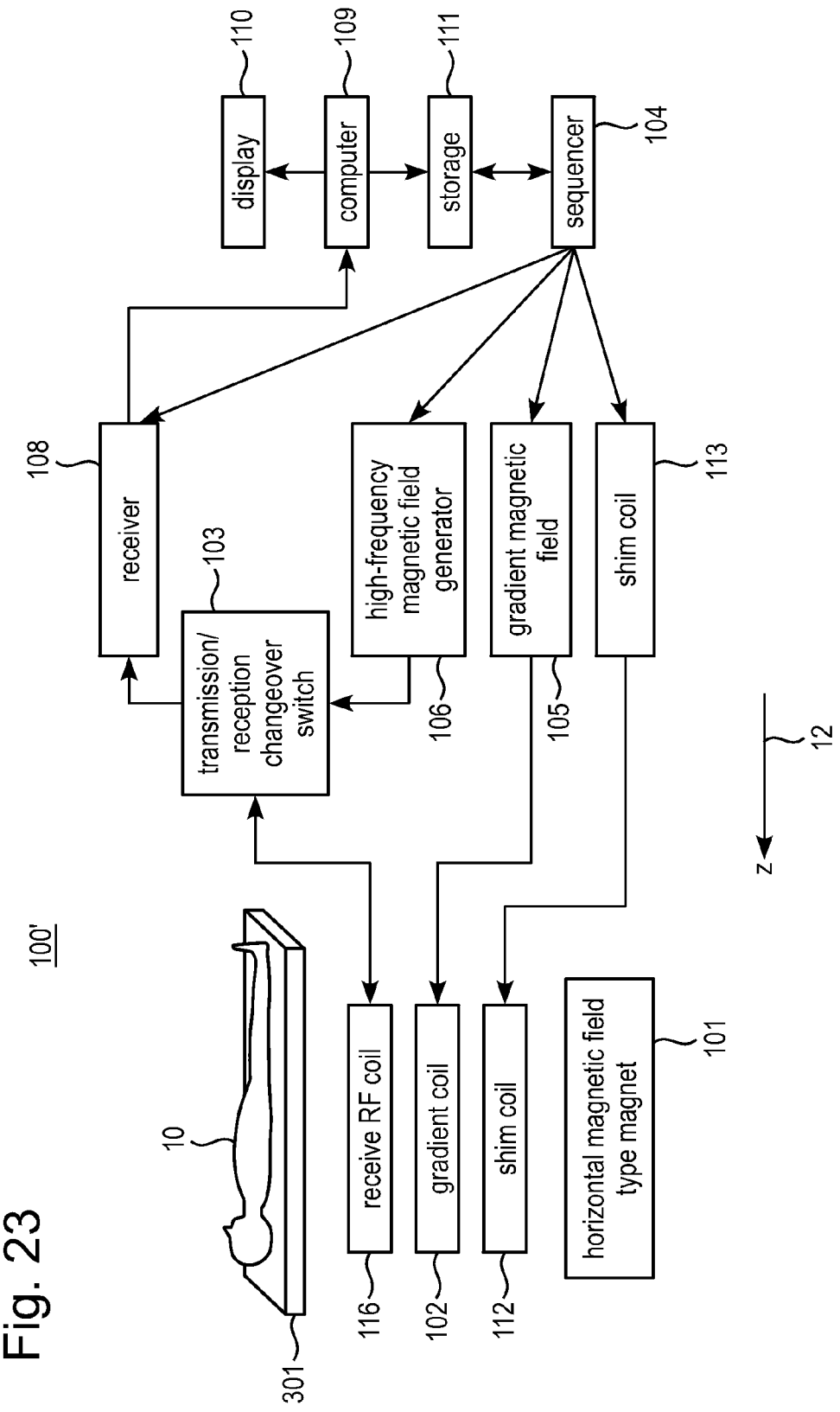
FIG. 23 is a block diagram showing a schematic configuration of an MRI device using an RF coil unit according to the first embodiment as a transmit and receive coil.

An example of use of the RF coil unit 25 used in the first embodiment as a transmit and receive RF coil is explained below. FIG. 23 shows a schematic configuration diagram of an MRI device 100' using the RF coil unit 25 of the first embodiment as a transmit and receive coil. Although the basic configurations of the MRI device 100' of this embodiment are substantially the same as those of the first embodiment, it is different from that of the first embodiment in that, as shown in this drawing, the decoupling circuit driver 115 is unnecessary, a transmit and receive RF coil 116 is used instead of the transmit RF coil 107 and the receive RF coil 114, a transmit and receive RF coil 116 is connected to a transmission/reception changeover switch 103, and two outputs of the transmission/reception changeover switch 103 are connected to the high-frequency magnetic field generator 106 and the receiver 108, respectively. In addition, although not shown in FIG. 23, the transmission/reception changeover switch 103 is connected to the sequencer 104. The structure of the RF coil unit 25 and the tuning method of the values of the elements in the RF coil unit 25 are the same as those of the first embodiment. The differences from the first embodiment are explained below.

When the RF coil unit 25 shown in FIG. 3A, FIG. 3B and FIG. 3C is used as the transmit and receive RF coil 116, the first signal lines 7 and the second signal lines 8 shown in FIG. 3A, FIG. 3B and FIG. 3C are each connected to a balun (balanced-to-unbalanced transformer, not shown) for eliminating common node noise, and outputs of the baluns are connected to two of the transmission/reception changeover switches 103, respectively.

It will be explained below that the RF coil unit 25 tuned as described above prevents the electromagnetic coupling between the first surface coil 5 and the second surface coil 6, and operates as the transmit and receive RF coil 116.

A high-frequency magnetic field sent from the high-frequency magnetic field generator 106 is amplified by the transmit power amplifier, passes through the transmission/reception changeover switch 103 which is made to be in the ON state for transmission by the sequencer 104, passes through the balun, and applied to each of the first signal lines 7 and the second signal lines 8 of the RF coil unit 25. According to the reciprocal theory, the state of the electromagnetic coupling between the first surface coil 5 and the second surface coil 6 observed when a high-frequency magnetic field is applied to the RF coil unit 25 is the same as that observed when the RF coil unit 25 detects the high-frequency magnetic field. Therefore, as in the case of the first embodiment, by tuning the inductance $L_d$ of the loop conductor 9 and the value $C_d$ of the capacitor 11 in the electromagnetic decoupling coil 13 of the RF coil unit 25 shown in FIG. 3A, FIG. 3B and FIG. 3C, electromagnetic coupling between the first surface coil 5 and the second surface coil 6 can be prevented. Therefore, without suffering from electromagnetic coupling, the RF coil unit 25 can apply a high-frequency magnetic field to the test subject 10 so as to operate as a transmit RF coil. Further, also when magnetic resonance signals generated by the test subject 10 are detected with the RF coil unit 25 after the high-frequency magnetic field is applied to the test subject 10, as in the case of the first embodiment, by tuning the inductance $L_d$ of the loop conductor 9 and the value $C_d$ of the capacitor 11 in the electromagnetic decoupling coil 13 of the RF coil unit 25 shown in FIG. 3A, FIG. 3B and FIG. 3C, electromagnetic coupling between the first surface coil 5 and the second surface coil 6 can be prevented. Therefore, without suffering from electromagnetic coupling, the RF coil unit 25 detects magnetic resonance signals, and sends the detected magnetic resonance signals to the receiver 108 via the transmission/reception changeover switch 103 which is made to be in the ON state for reception by the sequencer 104. As described above, the RF coil unit 25 functions as the transmit and receive RF coil 116 without suffering from electromagnetic coupling.

As explained above, according to this embodiment, the electromagnetic coupling between the first surface coil 5 and the second surface coil 6 of the RF coil unit 25 which functions as the transmit and receive RF coil 116 can be prevented by tuning the inductance $L_d$ of the loop conductor 9 and the value $C_d$ of the capacitor 11 in the electromagnetic decoupling coil 13. In particular, if the inductance $L_d$ of the loop conductor 9 is fixed in advance, it is sufficient to tune only the value $C_d$ of the capacitor 11 so as to satisfy the equation (12). Therefore, the tuning can be attained only by changing value of one capacitor, thus the tuning is easy, and reproducibility thereof is also high. Accordingly, time and effort required for the tuning can be reduced, and the production cost of the RF coil can be reduced.

DENOTATION OF REFERENCE NUMERALS

1: First capacitor, 2: second capacitor, 3: third capacitor, 4: fourth capacitor, 5: first surface coil, 6: second surface coil, 7: first signal lines, 8: second signal lines, 9: loop conductor, 10: test subject, 11: capacitor, 12: coordinate system, 13: electromagnetic decoupling coil, 14: equivalent circuit of electromagnetic decoupling coil, 15: AC source, 16: inductive current, 17: first high-frequency magnetic field, 18: second high-frequency magnetic field, 19: equivalent inductance of loop conductor 9, 20: direction of the first high-frequency magnetic field, 21: direction of the second high-frequency magnetic field, 22: first plane, 23: second plane, 24: cross point of figure-of-eight coil, 25: RF coil unit, 25': RF coil unit, 25A: RF coil unit, 25B: RF coil unit, 26: RF coil unit, 27: RF coil unit, 28: array coil, 28A: array coil, 29: array coil, 29A: array coil, 30: center axis, 31: bobbin, 32: circumferential direction, 33: surface coil, 34: RF coil unit, 35: RF coil unit, 36: RF coil unit, 37: third surface coil, 39: decoupling circuit, 41: first plane, 42: second plane, 43: third plane, 44: plane, 45: plane, 47: capacitor, 48: decoupling circuit, 49: decoupling circuit, 50: decoupling circuit, 51: inductor, 52: inductor, 53: inductor, 54: equivalent circuit of the RF coil unit 25, 55: electric current flowing in the first surface coil 5, 56: electric current flowing in the second surface coil, 59: electric current flowing in the loop conductor 9, 61: PIN diode, 62: cross diode, 66: control current, 71: first trimmer capacitor, 72: second trimmer capacitor, 73: third trimmer capacitor, 74: fourth trimmer capacitor, 75: fifth trimmer capacitor, 85: equivalent inductance of the first surface coil 5, 86: equivalent inductance of the second surface coil 6, 91: sheet conductive element, 95: equivalent resistance of the first surface coil 5, 96: equivalent resistance of the second surface coil 6, 99: equivalent resistance of the loop conductor 9, 100: MRI device, 101: magnet of horizontal magnetic field type, 102: gradient coil, 103: transmission/reception changeover switch, 104: sequencer, 105: gradient magnetic field power supply, 106: high-frequency magnetic field generator, 107: transmit RF coil, 108: receiver, 109: computer, 110: display, 111: storage, 112: shim coil, 113: power supply for shim coil, 114: receive RF coil, 115: decoupling circuit driver, 116: transmit and receive RF coil, 158: signal lines for control, 200: MRI device, 201: magnet of vertical magnetic field type, 301: patient table, 900: static magnetic field.

The invention claimed is:

1. A high-frequency coil for a magnetic resonance imaging device, the magnetic imaging device having a plurality of surface coils and a resonance frequency corresponding to a frequency of a magnetic resonance signal of a predetermined nucleus, the high-frequency coil comprising:
  an electromagnetic decoupling means for preventing electromagnetic coupling between adjacent surface coils of the plurality of surface coils,
  wherein a plurality of the surface coils are disposed at intervals along a first direction,
  wherein the electromagnetic decoupling means comprises a loop conductor, the loop conductor comprising a capacitor,
  wherein the loop conductor is disposed at such a position that the loop conductor is magnetically coupled to two adjacent surface coils of the plurality of surface coils and generates a magnetic flux in a direction for canceling a magnetic flux generated by one of the two adjacent surface coils and interlinking with the other surface coil, and the loop conductor does not contact the two adjacent surface coils,
  wherein the loop conductor is in a plane perpendicular to a plane of the two adjacent surface coils and is a loop having no crossovers, and
  wherein an inductance of the loop conductor and a value of the capacitor are tuned so that a sum of magnetic fluxes interlinking with the other surface coil is minimized, and a resonance frequency of the electromagnetic decoupling means is smaller than a resonance frequency of the high-frequency coil.

2. The high-frequency coil according to claim 1, wherein the inductance $L_d$ of the loop conductor, the value $C_d$ of the capacitor, Q factor $Q_H$ of the loop conductor at the resonance frequency, and angular frequency $\omega_H$ of the resonance frequency satisfy the relationship represented as:

$$\frac{\omega_H^2 L_d C_d}{Q_H(\omega_H^2 L_d C_d - 1)} < \frac{1}{20}.$$

3. The high-frequency coil according to claim 1, wherein the loop conductor is disposed between the two adjacent surface coils, and disposed in a third plane which includes an intersection of a first plane in which one of the adjacent surface coils substantially exists and a second plane in which the other surface coil substantially exists.

4. The high-frequency coil according to claim 3, wherein angle formed by the first plane and the third plane and angle formed by the second plane and the third plane are equal to each other.

5. The high-frequency coil according to claim 3, wherein a part of the loop conductor is disposed at a position at which the first plane and the second plane intersect.

6. The high-frequency coil according to claim 1, wherein the first direction is a circumferential direction.

7. The high-frequency coil according to claim 1, wherein the surface coils are disposed in the first direction as well as a second direction different from the first direction.

8. The high-frequency coil according to claim 7, wherein the electromagnetic decoupling means is disposed between the surface coils adjacent in at least one of the first direction and the second direction.

9. The high-frequency coil according to claim 1, wherein the surface coils are loop coils.

10. The high-frequency coil according to claim 1, wherein the surface coils are figure-of-eight coils.

11. The high-frequency coil according to claim 1, wherein at least one of the capacitors provided in the electromagnetic decoupling means is a trimmer capacitor.

12. The high-frequency coil according to claim 1,
wherein at least a part of the loop conductor of the electromagnetic decoupling means constituted by a sheet conductive element, and
wherein one of surfaces of the sheet conductive element faces the center of loop of the loop conductor.

13. The high-frequency coil according to claim 1,
wherein the high-frequency coil functions as a receive coil for detecting magnetic resonance signals of the predetermined nucleus, and
wherein the loop conductor of the electromagnetic decoupling means comprises a decoupling means for preventing magnetic coupling with a transmit coil.

14. The high-frequency coil according to claim 13, wherein the decoupling means is a circuit in which a capacitor is connected in parallel to a circuit having a PIN diode and an inductor connected in series.

15. The high-frequency coil according to claim 13, wherein the decoupling means is a circuit in which a capacitor is connected in parallel to a circuit having a cross diode and an inductor connected in series.

16. A magnetic resonance imaging device having a resonance frequency corresponding to a frequency of a magnetic resonance signal of a predetermined nucleus, the magnetic resonance imaging device comprising:
a static magnetic field generating means for generating a static magnetic field;
a gradient magnetic field generating means for generating a gradient magnetic field;
a high-frequency magnetic field generating means for generating a high-frequency magnetic field;
a transmit coil for irradiating the high-frequency magnetic field on a test subject;
a receive coil for detecting magnetic resonance signals generated from the test subject;
a receiving means for receiving the magnetic resonance signals detected;
a control means for controlling the gradient magnetic field generating means, the high-frequency magnetic field generating means and the receiving means; and
a plurality of surface coils disposed at intervals along a first direction,
wherein the receive coil is a high-frequency coil comprising an electromagnetic decoupling means for preventing electromagnetic coupling between adjacent surface coils of the plurality of surface coils,
wherein the electromagnetic decoupling means comprises a loop conductor, the loop conductor comprising a capacitor,
wherein the loop conductor is disposed at such a position that the loop conductor is magnetically coupled to two adjacent surface coils of the plurality of surface coils and generates a magnetic flux in a direction for canceling a magnetic flux generated by one of the two adjacent surface coils and interlinking with the other surface coil, and the loop conductor does not contact the two adjacent surface coils,
wherein the loop conductor is in a plane perpendicular to a plane of the two adjacent surface coils and is a loop having no crossovers,
wherein an inductance of the loop conductor and a value of the capacitor are tuned so that a sum of magnetic fluxes interlinking with the other surface coil is minimized, and a resonance frequency of the electromagnetic decoupling means is smaller than a resonance frequency of the high-frequency coil, and
wherein the loop conductor of the electromagnetic decoupling means comprises a decoupling means for preventing magnetic coupling with the transmit coil.

17. A magnetic resonance imaging device having a resonance frequency corresponding to a frequency of a magnetic resonance signal of a predetermined nucleus, the magnetic resonance imaging device comprising:
a static magnetic field generating means for generating a static magnetic field;
a gradient magnetic field generating means for generating a gradient magnetic field;
a high-frequency magnetic field generating means for generating a high-frequency magnetic field;
a transmit coil for irradiating the high-frequency magnetic field on a test subject;
a receive coil for detecting magnetic resonance signals generated from the test subject;
a receiving means for receiving the magnetic resonance signals detected;
a control means for controlling the gradient magnetic field generating means, the high-frequency magnetic field generating means and the receiving means; and
a plurality of surface coils disposed at intervals along a first direction,
wherein the transmit coil is a high-frequency coil comprising an electromagnetic decoupling means for preventing electromagnetic coupling between adjacent surface coils of the plurality of surface coils,
wherein the electromagnetic decoupling means comprises a loop conductor, the loop conductor comprising a capacitor,
wherein the loop conductor is disposed at such a position that the loop conductor is magnetically coupled to two adjacent surface coils of the plurality of surface coils and generates a magnetic flux in a direction for canceling a magnetic flux generated by one of the two adjacent surface coils and interlinking with the other surface coil, and the loop conductor does not contact the two adjacent surface coils,
wherein the loop conductor is in a plane perpendicular to a plane of the two adjacent surface coils and is a loop having no crossovers,
wherein an inductance of the loop conductor and a value of the capacitor are tuned so that a sum of magnetic fluxes interlinking with the other surface coil is minimized, and a resonance frequency of the electromagnetic decoupling means is smaller than a resonance frequency of the high-frequency coil, and
wherein the loop conductor of the electromagnetic decoupling means comprises a decoupling means for preventing magnetic coupling with the receive coil.

* * * * *